United States Patent [19]
Uno et al.

[11] Patent Number: 5,963,474
[45] Date of Patent: Oct. 5, 1999

[54] SECONDARY STORAGE DEVICE USING NONVOLATILE SEMICONDUCTOR MEMORY

[75] Inventors: Hiroaki Uno; Yasutsugu Nagusa; Takashi Onodera; Hideaki Miyashita, all of Osaka; Kenichi Kuwako, Kawasaki, all of Japan

[73] Assignee: Fujitsu Limited, Kawasaki, Japan

[21] Appl. No.: 09/160,858

[22] Filed: Sep. 25, 1998

[30] Foreign Application Priority Data

May 11, 1998 [JP] Japan ................................. 10-127251

[51] Int. Cl.[6] .............................. G11C 16/04; G11C 7/00
[52] U.S. Cl. .............................. 365/185.04; 365/185.11; 365/185.29; 365/185.33; 365/218
[58] Field of Search .......................... 365/185.04, 185.11, 365/185.29, 185.33, 218, 230.03

[56] References Cited

U.S. PATENT DOCUMENTS

| | | | |
|---|---|---|---|
| 5,611,067 | 3/1997 | Okamoto et al. | 365/230.03 |
| 5,818,771 | 10/1998 | Yasu et al. | 365/185.04 |

FOREIGN PATENT DOCUMENTS

| | | |
|---|---|---|
| 62-52796 | 3/1987 | Japan . |
| 62-283497 | 12/1987 | Japan . |
| 4-301297 | 10/1992 | Japan . |
| 5-158806 | 6/1993 | Japan . |
| 06119252 | 4/1994 | Japan . |
| 07064831 | 3/1995 | Japan . |
| 07122083 | 5/1995 | Japan . |
| 0816482 | 1/1996 | Japan . |
| 09306186 | 11/1997 | Japan . |

*Primary Examiner*—Trong Phan
*Attorney, Agent, or Firm*—Staas & Halsey

[57] ABSTRACT

A secondary storage device using a nonvolatile semiconductor memory in which individual block areas constituting the nonvolatile semiconductor memory can be used up to their limit of use. When the number of repetitions of erasure in a second block area has reached a predetermined reference value, a searching unit searches active block areas for an alternate block area. A second writing unit writes information which has been stored in the alternate block area, into the second block area. A second correspondence modifying unit associates the physical block number with the logical block number and causes a logical-physical correspondence storing unit to store the correspondence of the thus-associated block numbers. A second erasing unit erases the information stored in the alternate block area and treats the block area with the physical block number as a spare block area.

18 Claims, 18 Drawing Sheets

PHYSICAL LOCATION
(PHYSICAL NO.)

| # | FIG. 10 (A) | | FIG. 10 (B) |
|---|---|---|---|
| 1 | LOGICAL NO.: 0<br>ERASURE COUNT: 0<br>LOGICAL BLOCK WRITE COUNT: 1<br>ALTERNATION REFERENCE VALUE: 8192<br>DATA AREA: A | ERASE | LOGICAL NO.: 0<br>ERASURE COUNT: 0<br>LOGICAL BLOCK WRITE COUNT: 1<br>ALTERNATION REFERENCE VALUE: 8192<br>DATA AREA: A |
| 2 | LOGICAL NO.: 1<br>ERASURE COUNT: 0<br>LOGICAL BLOCK WRITE COUNT: 1<br>ALTERNATION REFERENCE VALUE: 8192<br>DATA AREA: B | ADD 1<br>AND WRITE<br>WRITE<br>AS IT IS | LOGICAL NO.: SPARE<br>ERASURE COUNT: 1<br>LOGICAL BLOCK WRITE COUNT: –<br>ALTERNATION REFERENCE VALUE: 8192<br>DATA AREA: NIL |
| 3 | LOGICAL NO.: 2<br>ERASURE COUNT: 0<br>LOGICAL BLOCK WRITE COUNT: 1<br>ALTERNATION REFERENCE VALUE: 8192<br>DATA AREA: C | | LOGICAL NO.: 2<br>ERASURE COUNT: 0<br>LOGICAL BLOCK WRITE COUNT: 1<br>ALTERNATION REFERENCE VALUE: 8192<br>DATA AREA: C |
| 4 | LOGICAL NO.: 3<br>ERASURE COUNT: 0<br>LOGICAL BLOCK WRITE COUNT: 1<br>ALTERNATION REFERENCE VALUE: 8192<br>DATA AREA: D | | LOGICAL NO.: 3<br>ERASURE COUNT: 0<br>LOGICAL BLOCK WRITE COUNT: 1<br>ALTERNATION REFERENCE VALUE: 8192<br>DATA AREA: D |
| 5 | LOGICAL NO.: 4<br>ERASURE COUNT: 0<br>LOGICAL BLOCK WRITE COUNT: 1<br>ALTERNATION REFERENCE VALUE: 8192<br>DATA AREA: E | | LOGICAL NO.: 4<br>ERASURE COUNT: 0<br>LOGICAL BLOCK WRITE COUNT: 1<br>ALTERNATION REFERENCE VALUE: 8192<br>DATA AREA: E |
| 6 | LOGICAL NO.: 5<br>ERASURE COUNT: 0<br>LOGICAL BLOCK WRITE COUNT: 1<br>ALTERNATION REFERENCE VALUE: 8192<br>DATA AREA: F | | LOGICAL NO.: 5<br>ERASURE COUNT: 0<br>LOGICAL BLOCK WRITE COUNT: 1<br>ALTERNATION REFERENCE VALUE: 8192<br>DATA AREA: F |
| 7 | LOGICAL NO.: 6<br>ERASURE COUNT: 0<br>LOGICAL BLOCK WRITE COUNT: 1<br>ALTERNATION REFERENCE VALUE: 8192<br>DATA AREA: G | | LOGICAL NO.: 6<br>ERASURE COUNT: 0<br>LOGICAL BLOCK WRITE COUNT: 1<br>ALTERNATION REFERENCE VALUE: 8192<br>DATA AREA: G |
| 961 | LOGICAL NO.: SPARE<br>ERASURE COUNT: 0<br>LOGICAL BLOCK WRITE COUNT: –<br>ALTERNATION REFERENCE VALUE: 8192<br>DATA AREA: NIL | WRITE DATA | LOGICAL NO.: 1<br>ERASURE COUNT: 0<br>LOGICAL BLOCK WRITE COUNT: 2<br>ALTERNATION REFERENCE VALUE: 8192<br>DATA AREA: B2 |

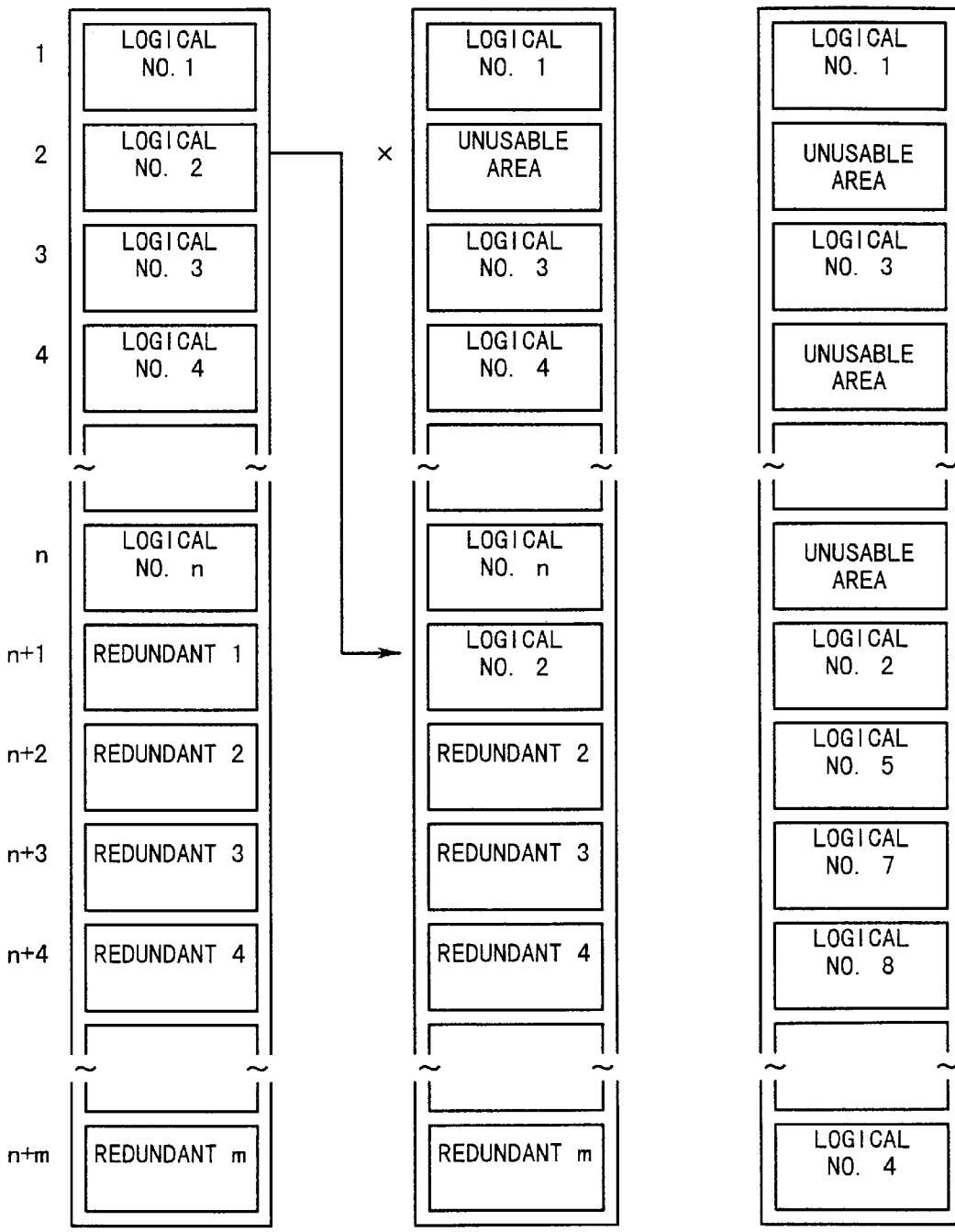

SECONDARY STORAGE DEVICE USING NONVOLATILE SEMICONDUCTOR MEMORY

BACKGROUND OF THE INVENTION (1) Field of the Invention

The present invention relates to a secondary storage device using nonvolatile semiconductor memory, and more particularly, to a secondary storage device using flash memory which permits rewriting of data on a block area-by-block area basis and which is provided with spare block areas.

(2) Description of the Related Art

Many of present-day small computers use a hard disk unit as a secondary storage device, but since the hard disk unit includes mechanical parts, it has a short service life, requires maintenance, and must be used under narrow environmental conditions (temperature, humidity, vibration) as compared with semiconductor memories. Secondary storage devices using flash memory are therefore expected much as an alternative to that using a hard disk unit.

Usually, a flash memory for use in a secondary storage device in place of a hard disk has a storage area thereof divided into a plurality of block areas (several tens of kilobytes each), and although data can be written on a byte-by-byte or word-by-word basis, data is erased on a block-by-block basis. A block becomes incapable of data writing or erasure after repeated writing and erasure operations, and at this point of time the life of the block comes to an end.

Conventional flash memory has a limitation (lifetime) on the number of repetitions of erasure, and therefore, to prolong the service life as a secondary storage device, the flash memory is provided with spare blocks equal to or greater than the number of active blocks so that spare blocks may be used in place of those blocks which are no longer capable of rewriting operations due to expiration of the block'life.

FIGS. 18(A) to 18(C) show the arrangement of blocks in a conventional flash memory. In FIGS. 18(A), 18(B) and 18(C) is illustrated, in that order, how block areas change with time. The flash memory is constituted by (n+m) block areas to which are respectively assigned the physical numbers 1 to (n+m), for example, and among these block areas, n block areas with the physical numbers 1 to n are active block areas while the remaining m block areas are spare block areas. The active block areas store respective pieces of information to which are assigned the logical numbers 1 to n (FIG. 18(A)).

Provided that the information with the logical number 2, for example, is to be updated, the block area with the physical number 2, in which the information with the logical number 2 has been stored until then, is checked as to the number of times erasure operations were performed. If, as a result, the count of erasure operations does not exceed a limit (e.g., 100,000 times), update information is written into the block area with the physical number 2. However, if the limit is exceeded, the block area with the physical number 2 is regarded as unusable any longer; therefore, the block area with the physical number (n+1) is newly assigned as a block for storing the information with the logical number 2 and an update for the information with the logical number 2 is written into this block (FIG. 18(B)).

A write operation like this is repeated, and when no further spare block areas are available (FIG. 18(C)), it is judged that the life of the flash memory has come to an end.

In conventional devices, however, if the information with the logical number 1, for example, is a kind of information that is scarcely altered once it is stored, it is very likely that the block area with the physical number 1 has undergone an erase operation only several times, leaving a considerable number of times an erase operation can be executed until the limit of service life is reached. Nevertheless, the service life of the flash memory is regarded as having expired as soon as all the spare blocks are used.

The limit to the number of repetitions of erase operation of flash memory includes a minimum value and an average value, which ordinarily differ from each other by about ten times. The minimum value is a guaranteed limit up to which individual block areas can be used with reliability, while the average value is based on actual data about how many times individual block areas can be subjected to erase operation before they become unusable. In general, the average value is approximately 1,000,000 times, as contrasted with the minimum value of 100,000 times.

The minimum value is conventionally adopted as the limit, and accordingly, even if the count of erase operations has reached the limit of 100,000 times, it does not necessarily mean that the block area immediately becomes unusable. A problem therefore arises in that, although in view of the average value erase operation can be repeated thereafter about 900,000 times, the use of the block area is stopped.

SUMMARY OF THE INVENTION

An object of the present invention is to provide a secondary storage device using nonvolatile semiconductor memory in which individual block areas constituting the nonvolatile semiconductor memory are used fully up to their limit of use.

To achieve the above object, there is provided a secondary storage device using a nonvolatile semiconductor memory which permits rewriting of data on a block area-by-block area basis and is provided with spare block areas. The secondary storage device comprises logical-physical correspondence storing means for storing correspondence between logical block numbers identifying respective pieces of information to be stored and physical block numbers identifying respective block areas constituting the nonvolatile semiconductor memory, and first writing means, responsive to a request to write information accompanied by a logical block number, for writing into a spare first block area the information with respect to which the write request has been made. The invention also includes physical block number reading means for referring to the logical-physical correspondence storing means to read out a physical block number corresponding to the logical block number accompanying the information with respect to which the write request was made and first erasing means for erasing information stored in a second block area with the physical block number read out by the physical block number reading means and treating the second block area as a spare block area. Furthermore, the present invention first correspondence modifying means for associating the physical block number of the first block area with the logical block number accompanying the information with respect to which the write request was made, and for causing the logical-physical correspondence storing means to store the correspondence of the thus-associated physical and logical block numbers and searching means for searching all block areas in the nonvolatile semiconductor memory except spare block areas for an alternate block area when the number of repetitions of erasure in the second block area has reached a predetermined reference value.

The invention further includes second writing means for writing into the second block area information stored in the alternate block area located by the searching means, second correspondence modifying means for associating the physical block number of the second block area with the logical block number of the information stored in the alternate block area and causing the logical-physical correspondence storing means to store the correspondence of the thus-associated physical and logical block numbers, and second erasing means for erasing the information stored in the alternate block area and treating the alternate block area as a spare block area.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 10(A) is a diagram showing individual block areas of the flash memory before a write process;

FIG. 10(B) is a diagram showing the individual block areas of the flash memory after the write process;

FIG. 18(A) is a diagram showing individual block areas of a conventional flash memory at a first moment;

FIG. 18(B) is a diagram showing the individual block areas of the conventional flash memory at a second moment; and FIG. 18(C) is a diagram showing the individual block areas of the conventional flash memory at a third moment.

DESCRIPTION OF THE PREFERRED EMBODIMENTS

Embodiments of the present invention will be hereinafter described with reference to the drawings.

Figure 1:
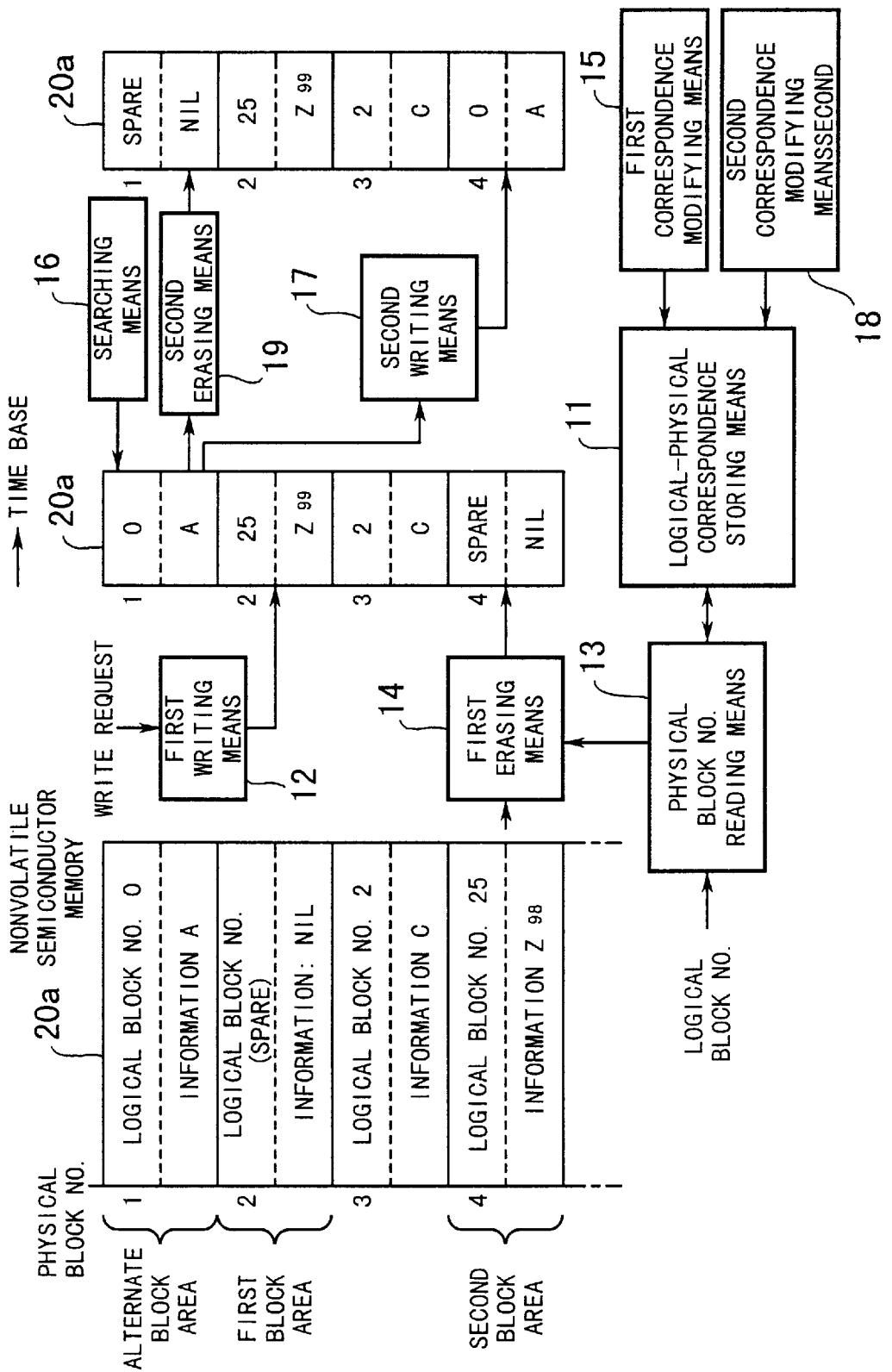
FIG. 1 is a diagram illustrating the principles of the present invention.

Referring first to FIG. 1, a theoretical configuration according to a first embodiment will be explained. The first embodiment comprises a logical-physical correspondence storing unit 11 for storing correspondence between logical block numbers identifying respective pieces of information to be stored and physical block numbers identifying respective block areas constituting a nonvolatile semiconductor memory 20a. The first embodiment also includes a first writing unit 12, responsive to a request to write information accompanied by a logical block number, for writing into a spare first block area the information with respect to which the write request has been made. Also, the first writing unit includes a decision unit to select a block area of which the number of repetitions of erasure is a minimum among all spare block areas. The selected block area is set as the first block area.

Moreover, the first embodiment includes a physical block number reading unit 13 for referring to the logical-physical correspondence storing means 11 to read out a physical block number corresponding to the logical block number accompanying the information with respect to which the write request was made. Also included is a first erasing unit 14 for erasing information stored in a second block area with the physical block number read out by the physical block number reading means 13 and treating the second block area.

Furthermore, the first embodiment also includes a spare block area, first correspondence modifying unit 15 for associating the physical block number of the first block area with the logical block number accompanying the information with respect to which the write request was made, and for causing the logical-physical correspondence storing unit 11 to store the correspondence of the thus-associated physical and logical block numbers. Also, the first embodiment includes a searching unit 16 for searching all block areas in the nonvolatile semiconductor memory 20a except spare block areas for an alternate block area when the number of repetitions of erasure in the second block area has reached a predetermined reference value. The searching unit includes an updating unit that updates the predetermined reference value to a greater value when the number of repetitions of erasure in the second block area has reached the predetermined reference value. A second writing unit 17 is included for writing into the second block area information stored in the alternate block area located by the searching means 16. Likewise, a second correspondence modifying unit 18 associates the physical block number of the second block area with the logical block number of the information stored in the alternate block area and causing the logical-physical correspondence storing unit 11 to store the correspondence of the thus-associated physical and logical block numbers. Finally, a second erasing unit 19 erases the information stored in the alternate block area and treats the alternate block area as a spare block area.

Each of the logical-physical correspondence storing means, the first writing means, the physical block number reading means, the first erasing means, the first correspondence modifying means, the searching means, the second writing means, the second correspondence modifying means and the second erasing means includes at least two means having a corresponding function.

In the configuration described above, the nonvolatile semiconductor memory 20a has a large number of block areas to which are respectively assigned the physical block numbers 1, 2, 3, 4, . . . , for example. The block area with the physical block number 1 stores, for example, information A with the logical block number 0, the block area with the physical block number 3 stores information C with the logical block number 2, and the block area with the physical block number 2 stores information $Z_{99}$ with the logical block number 25. The block area with the physical block number 4 has no information stored therein and is a spare block area.

Here, let it be assumed that the nonvolatile semiconductor memory 20a is requested to write information $Z_{99}$ accompanied by the logical block number 25, for example. The information $Z_{99}$ is an update for the information $Z_{98}$. In compliance with the request, the first writing means 12 searches the nonvolatile semiconductor memory 20a for a spare block area and finds, for example, a spare first block area, that is, the block area with the physical block number 2. The first writing means 12 writes the information $Z_{99}$, with respect to which the write request has been made, into the block area with the physical block number 2. Simultaneously, the physical block number reading means 13 refers to the logical-physical correspondence storing means 11 and reads out the physical block number 2 corresponding to the logical block number 25 accompanying the information $Z_{99}$ with respect to which the write request was made. The logical-physical correspondence storing means 11 stores the correspondence between logical block numbers and physical block numbers; in this case, it stores the physical block number 4 in association with the logical block number 25, for example.

The first erasing means 14 erases the information $Z_{98}$ stored in the second block area with the physical block number 4 read out by the physical block number reading means 13, and treats the function block area as a spare block area. Then, the first correspondence modifying means 15 associates the physical block number 2 of the first block area, in which the information $Z_{99}$ is stored, with the logical block number 25 accompanying the information $Z_{99}$, and causes the logical-physical correspondence storing means 11 to store this correspondence.

Subsequently, the searching means 16 checks the number of times the first erasing means 14 has performed erase operation with respect to the second block area with the physical block number 4, and if the count of erase operations has reached the predetermined reference value, which may be a plurality of predetermined values it searches the active block areas in the nonvolatile semiconductor memory 20a except the spare block areas for an alternate block area. As the alternate block area, a block area of which the count of erase operations is smaller than that of the second block area and of which the number of repetitions of logical block write is a minimum is selected. It is assumed that the block area with the physical block number 1, for example, is found as the alternate block area. Moreover, the searching means 16 includes a decision means for selecting a block area whose number of repetitions of erasure is smaller than that of the second block area and whose number of repetitions of logical block write is a minimum from among all block areas in the nonvolatile semiconductor memory except spare block areas, and setting the selected block area as the alternate block.

The second writing means 17 writes the information A, which has been stored in the alternate block area with the physical block number 1 located by the searching means 16, into the second block area with the physical block number 4. Then, the second correspondence modifying means 18 associates the physical block number 4 of the second block area with the logical block number 0 of the information A which has been stored in the alternate block area, and causes the logical-physical correspondence storing means 11 to store this correspondence. Further, the second erasing means 19 erases the information A stored in the alternate block area with the physical block number 1, and treats the block area with the physical block number 1 as a spare block area.

As described above, when a request to write update information has been made, the update information is written in a spare block area and the block area in which the corresponding original information has been stored until then is reserved as a spare block area. This permits the number of repetitions of an erasure operation with respect to the individual block areas to increase in a balanced manner. There is, however, a slight probability that a block area storing information with low update frequency will be turned in to a spare block area. Therefore, such a block area storing information with low update frequency is searched for and is reserved as a spare block area. In addition, the information with low update frequency is stored in a block area of which the count of erasure operations has reached the predetermined reference value.

Thus, variations in the number of repetitions of erasure among the block areas can be eliminated, permitting all of the block areas to be used up to their limit. Further, if abnormality in data write or erasure is checked for each of the block areas, then it is no longer necessary to set the limit of use to the aforementioned minimum value, making it possible to use each of the block areas up to its actual limit.

The first embodiment will be now described in detail. Note that, in the following description of the first embodiment, the nonvolatile semiconductor memory 20a in FIG. 1 corresponds to a flash memory 20.

Figure 2:
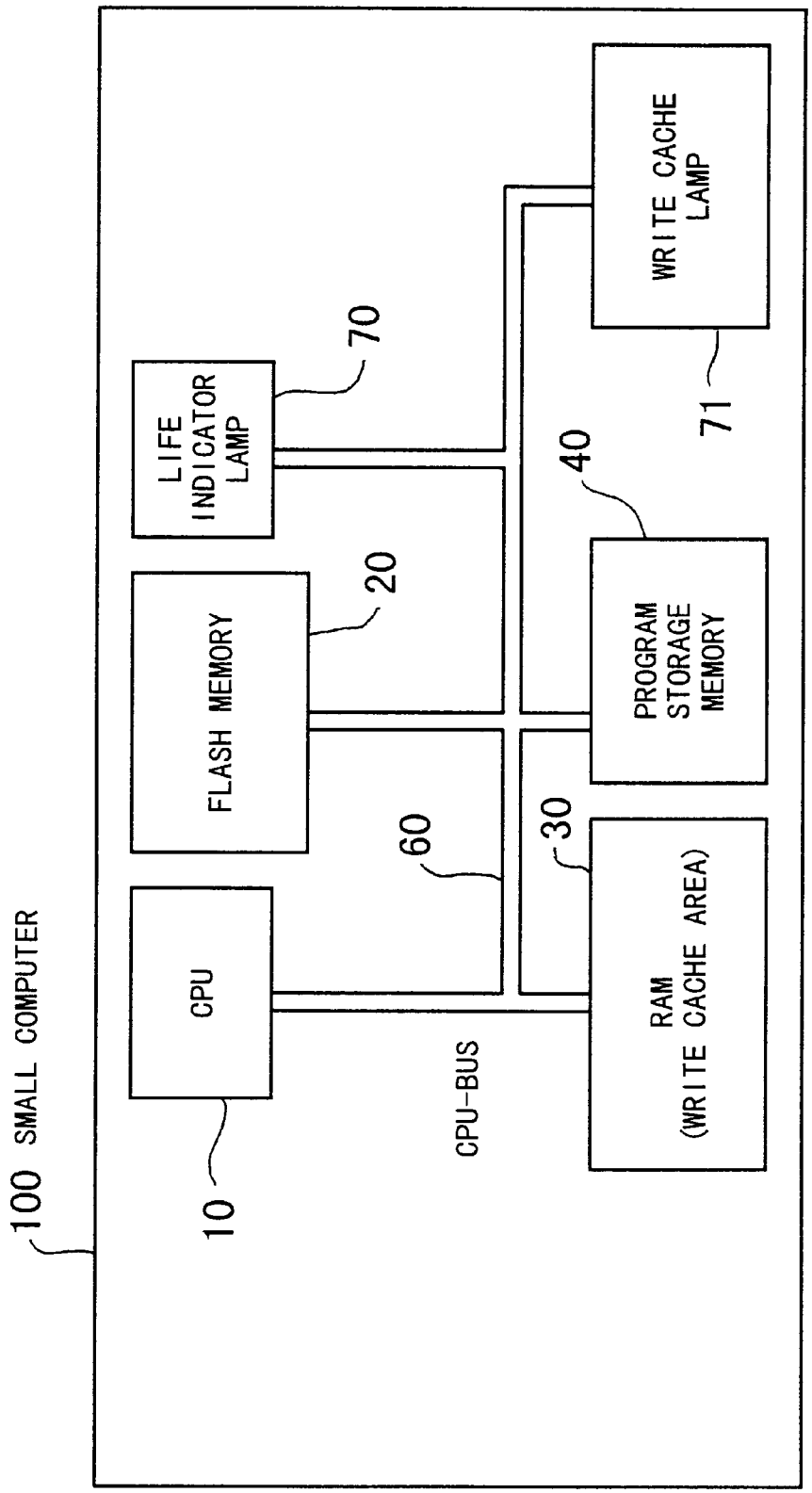
FIG. 2 is a diagram showing the configuration of a small computer, such as a personal computer, including a secondary storage device according to a first embodiment.

FIG. 2 illustrates the configuration of a small computer 100, such as a personal computer, including a secondary storage device according to the first embodiment.

The small computer 100 comprises a CPU 10, a program storage memory (ROM) 40 and a RAM 30 interconnected by a CPU-BUS 60, as in the configuration of an ordinary small computer. Specifically, the CPU 10 operates in accordance with programs stored in the program storage memory 40 and executes predetermined processes while temporarily storing data in the RAM 30.

The flash memory 20 serves as a secondary storage device and stores data that must not be lost when the power supply is cut off. This data storage process is carried out by the CPU 10, and the first writing means 12, the physical block number reading means 13, the first erasing means 14, the first correspondence modifying means 15, the searching means 16, the second writing means 17, the second correspondence modifying means 18 and the second erasing means 19, all appearing in FIG. 1, are functions achieved by the storage process of the CPU 10.

The RAM 30 has a memory area including a write cache area, and at the time of data write, the write cache area temporarily stores data before the data is written into the flash memory 20. The other RAM area than the write cache area stores data whose write location (specified by a sector number) is determined beforehand, among data that may be lost when the power is turned off.

A life indicator lamp 70 is lit when the flash memory 20 has become unusable due to expiration of its service life. A write cache lamp 71 is lit when write data is held in the write cache area of the RAM 30. The write cache lamp 71, when lit, serves to notify the maintenance technician that data which must not be erased is still held in the write cache area and is not yet written into the flash memory 20, thereby preventing the maintenance technician from turning off the power carelessly.

Figure 3:
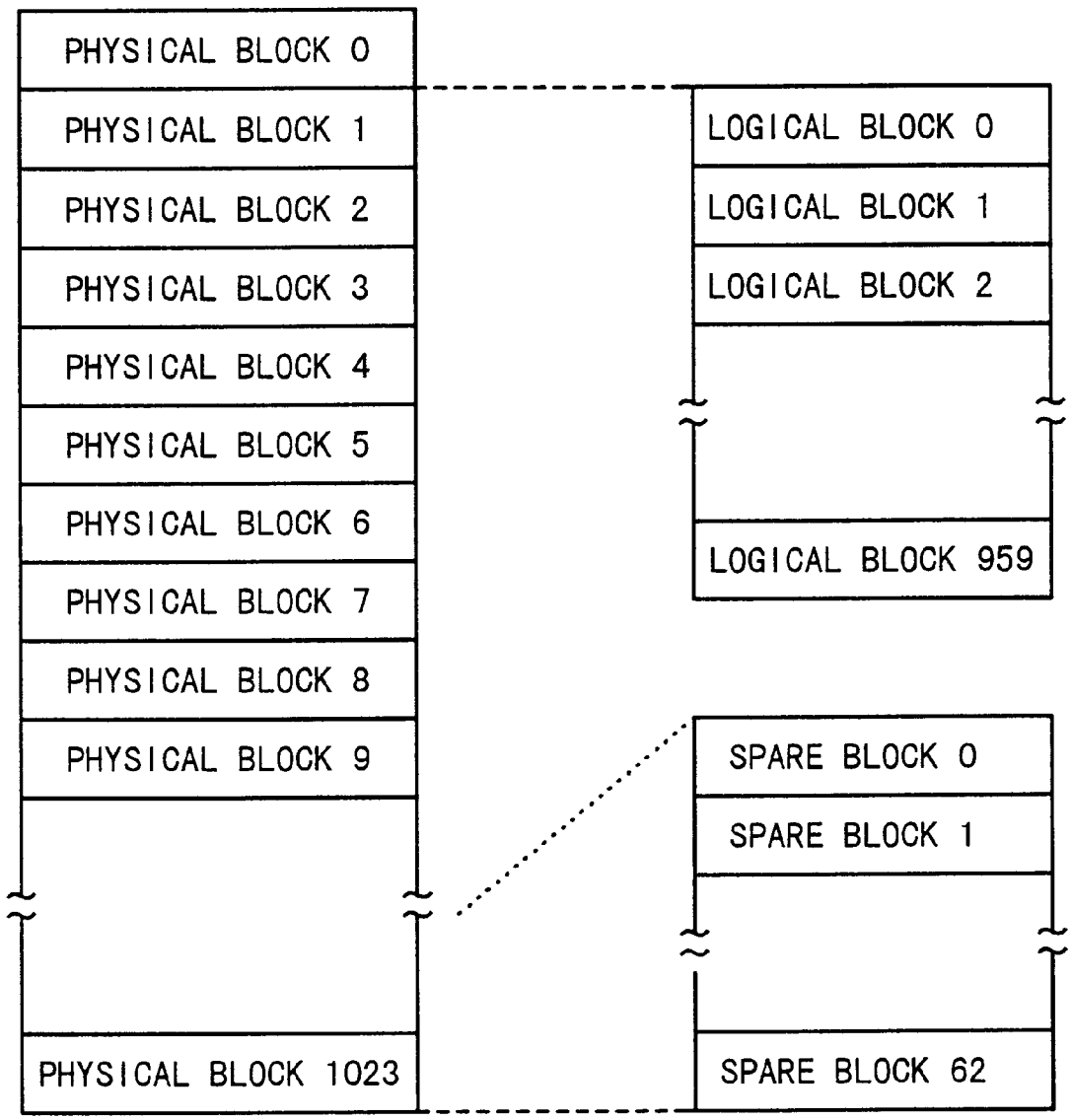
FIG. 3 is a diagram showing the arrangement of block areas of a flash memory.

FIG. 3 shows individual block areas of the flash memory 20.

The flash memory 20 is constituted by 1024 block areas to which are assigned the physical block numbers 0 to 1023, respectively. One block area has a capacity of 64 KB (1 KB=1024 bytes). The block area with the physical block number 0 is used to store format information, flash memory type, and a life flag. The block areas with the physical block numbers 1 to 1023 store disk data. The disk data means data which, in conventional systems, needs to be stored in the hard disk unit. Logical blocks are 960 in number, and accordingly, 63 spare blocks are provided.

If one sector is set to 512 bytes (value usually employed in SCSI), then one block can hold 128 sectors (=64×1024/ 512). One sector is used as an information area for storing control information while the remaining 127 sectors are used as a data area for storing disk data.

Figure 4:
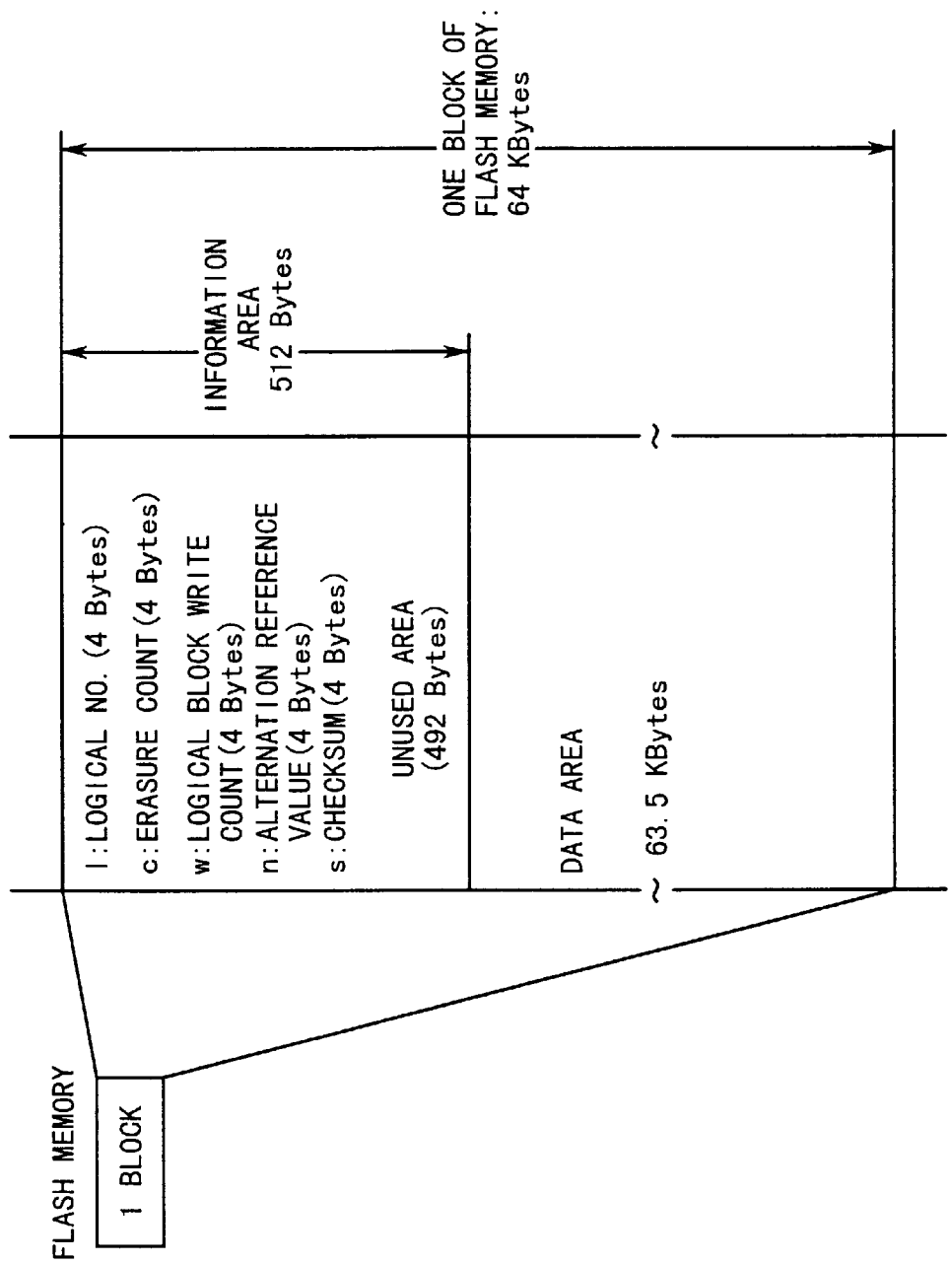
FIG. 4 is a diagram showing the internal arrangement of a block.

FIG. 4 shows the internal arrangement of a block. The information area includes a logical number field 1, an erasure count field c, a logical block write count field w, an alternation reference value field n, and a checksum field S. In the logical number field 1 is described the logical block number of the disk data stored in the data area. The logical block number is an identification number of disk data. If the block is a spare block, a code (e.g., FFFFFFFFH) indicative of spare block is described in the logical number field 1. In the erasure count field c, the number of times erase operation has been performed with respect to the block is described. Each time erase operation is executed in the block, the value written in the field is incremented by 1, and this helps determine whether the expiration of the life of the block is near or not. In the logical block write count field w is described the number of times write operation has been performed so as to update the disk data stored in the data area. In the alternation reference value field n, a reference value for comparison with the count of erase operations of this block is described. When the count of erase operations of the block has reached the alternation reference value, an alternation process described later is executed for this block. The checksum field s describes therein the sum of the data within the block and is used to determine whether or not data has been transmitted correctly.

The data area stores actual data as the disk data.

The limit to the number of repetitions of erasure operations (write operations) with respect to the flash memory 20 is, for example, 100,000 times as a minimum value and 1,000,000 times as an average value, and therefore, the alternation reference value is set to a value of 8192 ($=2^{13}$) which is approximately a tenth of the minimum value 100,000.

Data write and read processes which the CPU 10 executes with respect to the RAM 30 or the flash memory 20 will be now described.

Figure 5:
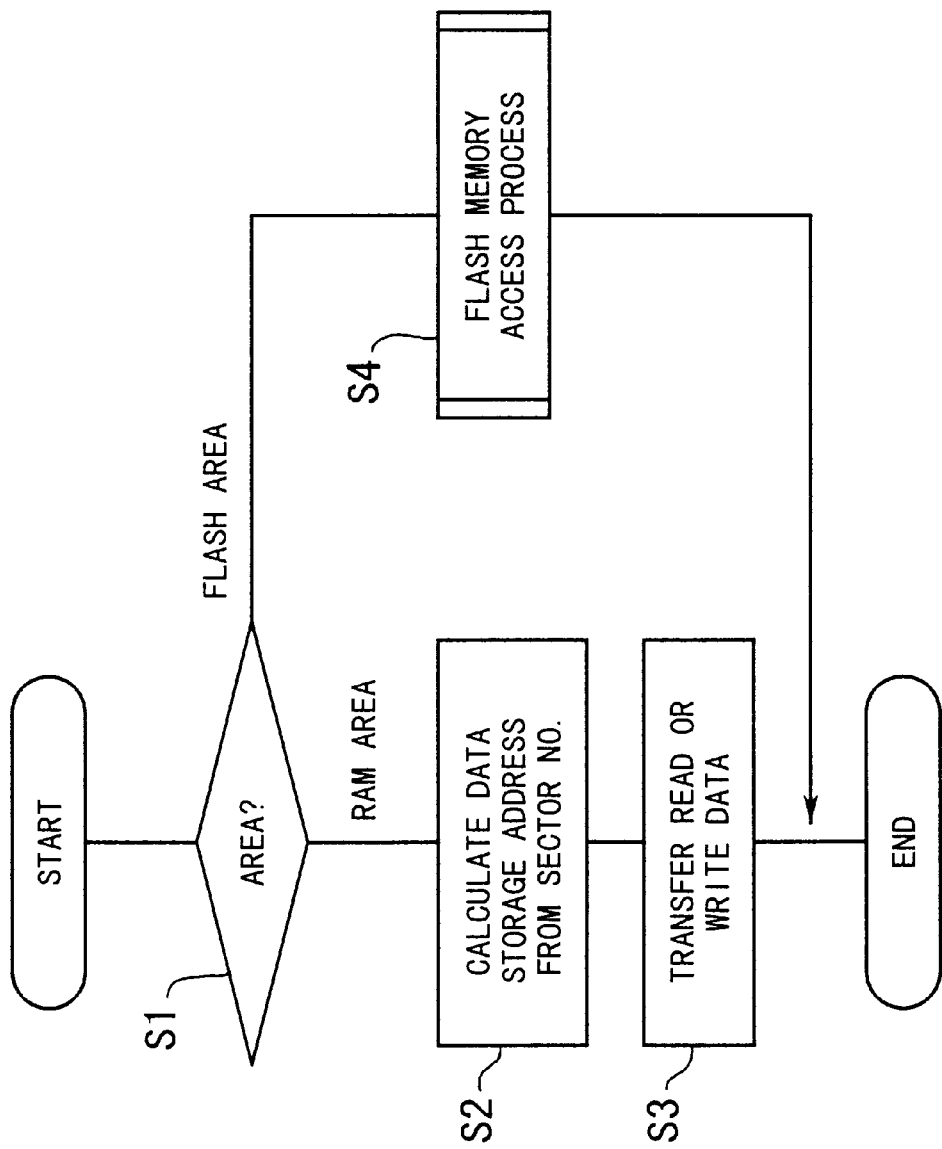
FIG. 5 is a flowchart showing the procedure for data write and read processes which a CPU executes with respect to RAM or flash memory.

FIG. 5 illustrates the procedure for the data write and read processes executed by the CPU 10 with respect to the RAM 30 or the flash memory 20. In the following explanation, reference will be made to the step numbers (S) in FIG. 5 where appropriate.

First, a determination is made as to whether or not data to be written or to be read out is associated with a sector number, and also whether or not this sector number corresponds to the RAM area (S1). If the results of the decisions are affirmative, that is, if the data to be written or to be read out is a kind of data which may be lost when the power is turned off and which is RAM area-related data whose write or read location is previously known, an address in the RAM 30 is calculated from the sector number (S2). Since one sector consists of 512 bytes, a target address can be obtained by subtracting the head sector number of the RAM area from the sector number, multiplying the remainder by 512, and adding the offset address to the product. In the case of data write, data to be written is transferred to the thus-obtained address of the RAM area, and in the case of data read, the contents of data stored at the obtained address of the RAM area are read out and transferred (S3).

If the results of the decisions in Step S1 are negative, that is, if the data in question is data relating to the flash memory 20, a flash memory access process is executed (S4).

Figure 6:
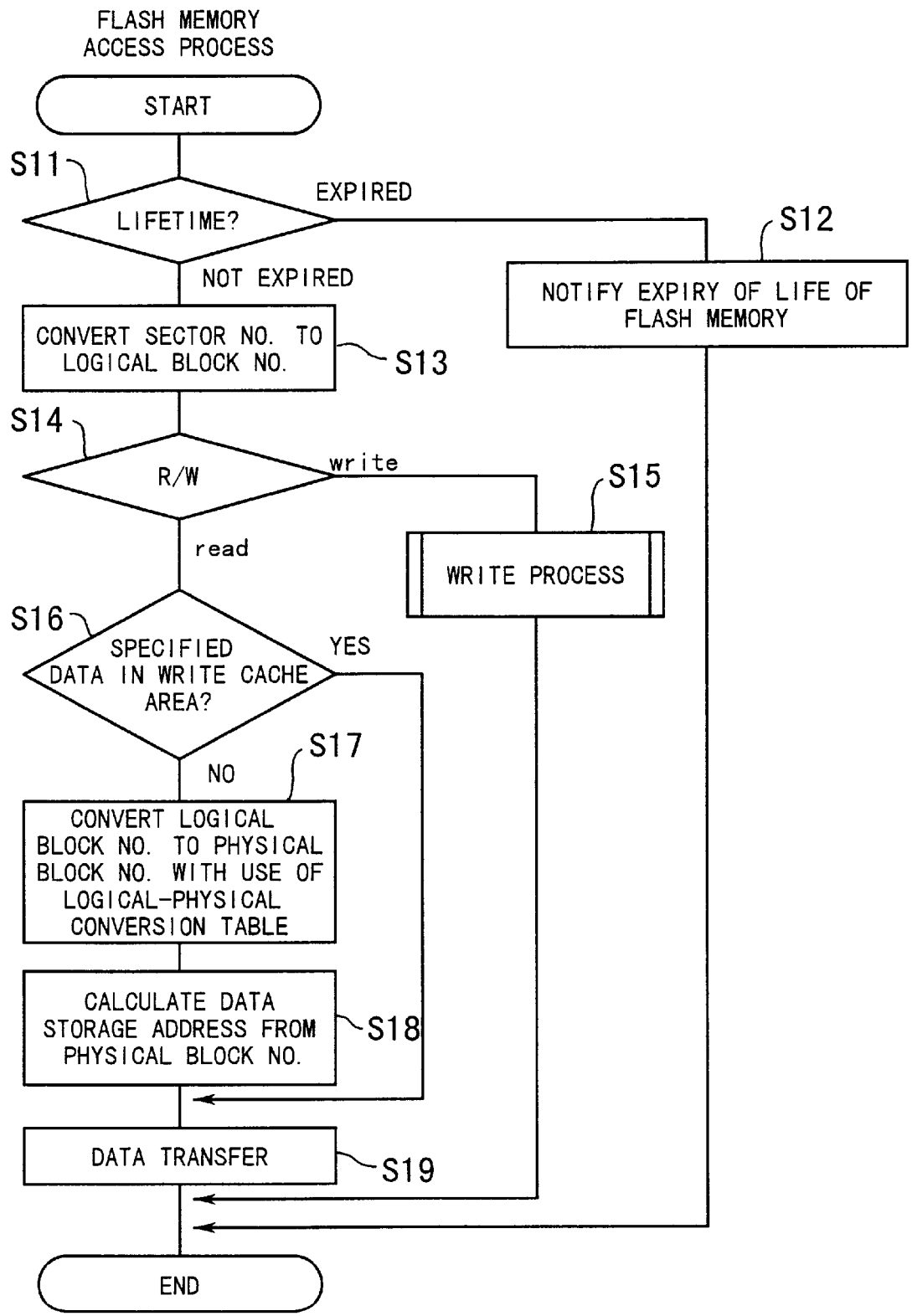
FIG. 6 is a flowchart showing details of a flash memory access process executed in Step S4 in FIG. 5.

FIG. 6 illustrates details of the flash memory access process executed in Step S4 in FIG. 5.

It is first determined whether or not the life of the flash memory 20 has come to an end (S11). This determination is made by referring to the life flag stored at the physical block number 0 in the flash memory 20. If the lifetime of the flash memory 20 has expired, then the life indicator lamp 70 is lit, thereby notifying the operator that the flash memory 20 is no longer usable because of the expiration of its life (S12).

If the lifetime of the flash memory 20 has not expired yet, the sector number is converted to a logical block number (S13). Specifically, since one block holds 127 sectors, the sector number is divided by 127 to obtain a quotient and a remainder, the quotient being indicative of a logical block number while the remainder being indicative of an offset location within a block. The division of the sector number by 127 may be effected through actual calculation or with the use of a table.

If a write operation is requested, a write process is executed (S14, S15). Details of the write process will be described later with reference to FIG. 7. On the other hand, if a read operation is requested, it is determined whether the data to be read out exists in the write cache area of the RAM 30 (S16). If the data exists in the write cache area, it is read out from the write cache area and transferred (S19). If the data does not exist in the write cache area, reference is made to a logical-physical conversion table to convert the logical block number to a physical block number (S17), and based on the obtained physical block number, an address at which the data is stored is calculated (S18). This conversion is performed by using the logical-physical conversion table used in the write process described later. Based on the address thus obtained, the data is read out from the flash memory 20 and transferred (S19).

FIG. 7(A) shows details of Step S15 in FIG. 6, and FIG. 7(B) shows a process which is executed upon completion of measurement of a predetermined time by a timer operated in the process of FIG. 7(A).

A determination is first made as to whether the data to be written is an update for the previously input data and also whether the original data exists in the write cache area of the RAM 30 (S21). If the original data exists in the write cache area, it is discarded (S22), and an elapsed time-indicative value of a timer associated with the original data, which timer started measuring time when the original data was written in the write cache area, is reset to zero (S23).

The update data is then written into the write cache area (S24), and the timer is started to measure time elapsed from this point of time (S25). The timer is associated with each piece of data to measure time elapsed from the moment at which the corresponding piece of data was written. If it is judged in Step S21 that the original data does not exist in the write cache area, the flow proceeds to Step S24.

When the elapsed time has reached a predetermined time (e.g., 2 seconds), the data held in the write cache area is written into the flash memory 20 and the data in the write cache area is erased (S26).

Thus, in the processes shown in FIGS. 7(A) and 7(B), the data to be written into the flash memory 20 is temporarily stored in the write cache area of the RAM 30. When the predetermined time has passed from the moment of data write, the data is transferred to the flash memory 20. If an update for the same data is written again before the predetermined time elapses, then the data is updated in the write cache area, so that the write and erase processes in the flash memory 20 are unnecessary, prolonging the lifetime the flash memory 20.

While data is stored in the write cache area, the write cache lamp 71 is lit, and upon erasure of the data, the lamp 71 is put out.

Details of the process executed in Step S26 in FIG. 7(B) will be now explained with reference to FIGS. 8 and 9.

Figure 8:
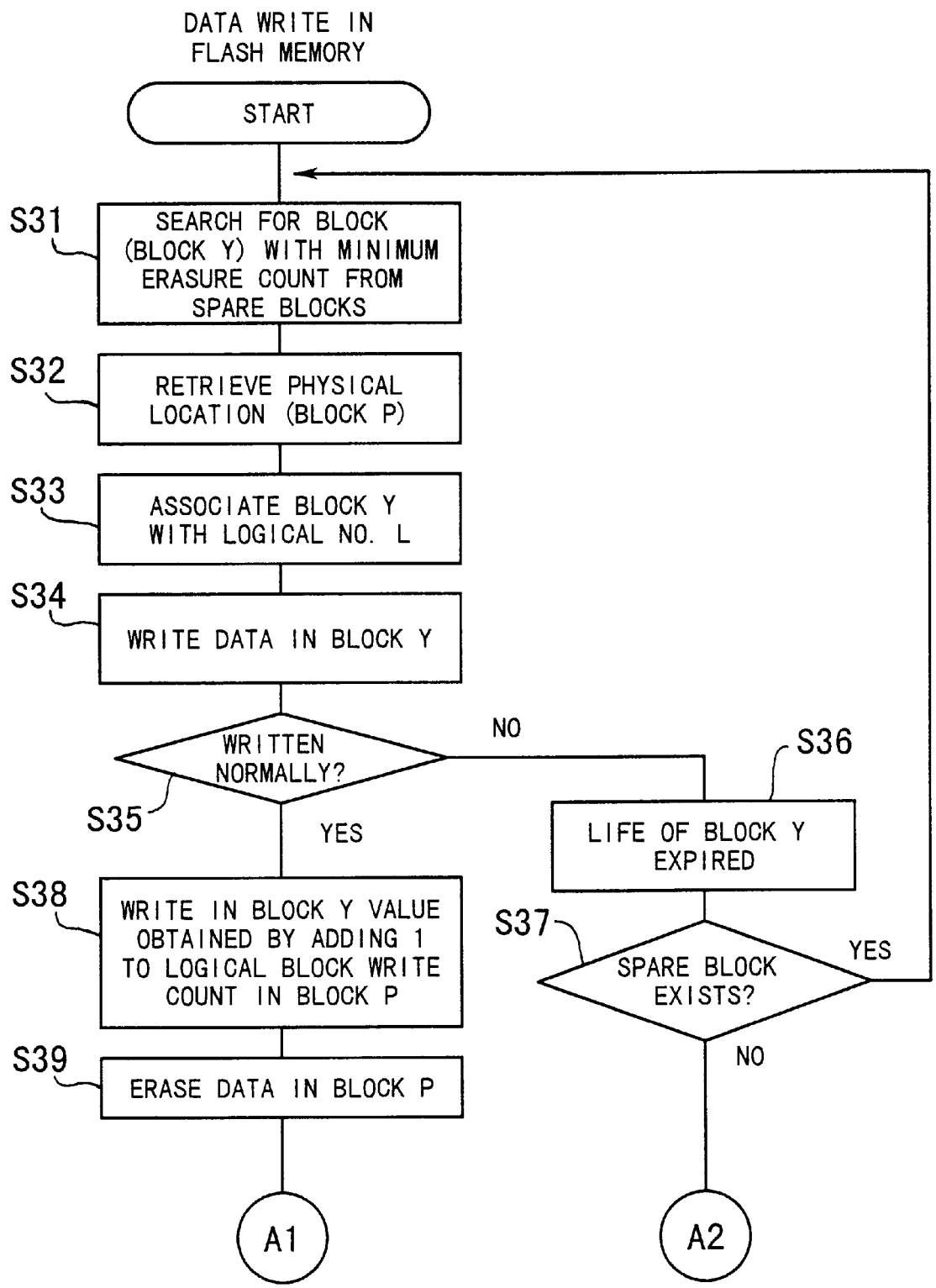
FIG. 8 is a flowchart showing the first half of a flash memory write process.
Figure 9:
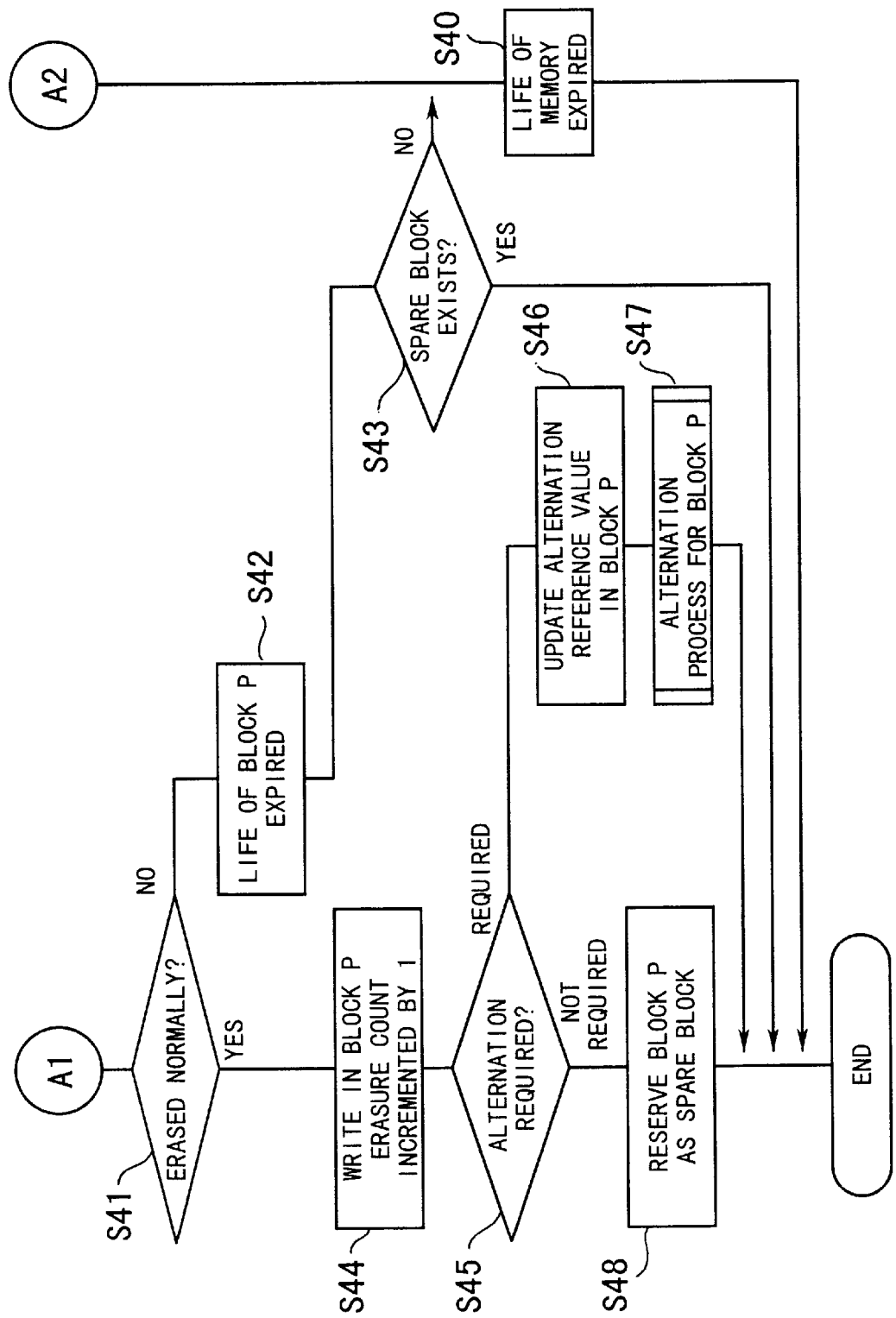
FIG. 9 is a flowchart showing the latter half of the flash memory write process.

FIGS. 8 and 9 illustrate the procedure for the process of writing data into the flash memory 20, wherein FIG. 8 shows the first half of the process while FIG. 9 shows the latter half of same.

It is here assumed that a request has been made to write update data with a logical block number L into the flash memory 20.

A spare block of which the value in the erasure count field c is a minimum is selected from among the spare blocks in the flash memory 20 and is set as a block Y (S31). Also, reference is made to the logical-physical conversion table to detect a physical block number corresponding to the logical block number L, and a block area with the detected physical block number is set as a block P (S32).

The physical block number of the block Y is associated with the logical block number L and this correspondence is stored in the logical-physical conversion table (S33), whereupon the update data with the logical block number L is written into the block Y (S34).

A status code output from the flash memory 20 is checked to determine whether or not the update data was normally written into the block Y (S35). If the update data was not written normally, the life of the block Y is regarded as having expired (S36) and thus, writing thereto or erasing thereof is inhibited. If there still exists a spare block in the flash memory 20, the flow returns to Step S31 (S37), to search for another spare block. That is, a checking means is provided to determine whether there is a spare block of which use is not inhibited. If there is no spare block remaining, the life of the flash memory 20 is regarded as having expired and the life indicator lamp 70 is lit (S40). The lighting of the life indicator lamp serves as a notifying means to provide notification that the flash memory is unusable.

If it is judged as a result of the decision in Step S35 that the update data was written normally, the logical block number L is written into the logical number field 1 of the block Y, and a value obtained by adding 1 to the value in the logical block write count field w of the block P is written into the logical block write count field w of the block Y (S38).

Then, the information stored in the information area and the data area of the block P is erased (S39). Before the erasure, however, the values described in the erasure count field c and the alternation reference value field n are held in memory. These writings to the flash memory 20 and erasures therefrom are monitored by a monitoring means.

The status code output from the flash memory 20 is then checked to determine whether or not the erase operation of the block P was normally performed (S41). If the erase operation was not performed normally, it is judged that the life of the block P has expired (S42). If there still exists a spare block in the flash memory 20, the write process is ended (S43). If there is no spare block remaining, the life of the flash memory 20 is regarded as having expired and the life indicator lamp 70 is lit (S40).

If it is confirmed in Step S41 that the erase operation was normally carried out, a value obtained by adding 1 to the value which had been described in the erasure count field c of the block P and is held in memory is written into the erasure count field c of the block P, and the value which had been described in the alternation reference value field n of the block P and is held in memory is written as it is into the alternation reference value field n of the block P (S44).

The process described above will be now explained taking a specific example.

FIGS. 10(A) and 10(B) show a specific example of individual block areas in the flash memory 20 with respect to which a write process is carried out, wherein FIG. 10(A) shows a state of the flash memory 20 before the write process, and FIG. 10(B) shows a state of the flash memory 20 after the write process. In FIGS. 10(A) and 10(B), the logical block number L mentioned above with reference to FIG. 9 corresponds to the logical block number 1, the block P in FIG. 9 corresponds to the block area with the physical block number 2, and the block Y in FIG. 9 corresponds to the block area with the physical block number 961.

Referring again to FIG. 9, it is then determined whether or not an alternation process is necessary for the block P which has now been reserved as a spare block (S45). Specifically, the value newly written in the erasure count field c of the block P is compared with the value in the alternation reference value field n thereof, and if the former has reached the latter, it is judged that the alternation process is required. Prior to execution of the alternation process, the value in the alternation reference value field n of the block P is updated (S46) by adding the value 8192 to the value held until then.

Subsequently, the alternation process for the block P is carried out (S47). Details of the alternation process will be described with reference to FIG. 11.

If it is judged in Step S45 that no alternation process is required, the block P is reserved as a spare block (S48).

Figure 11:
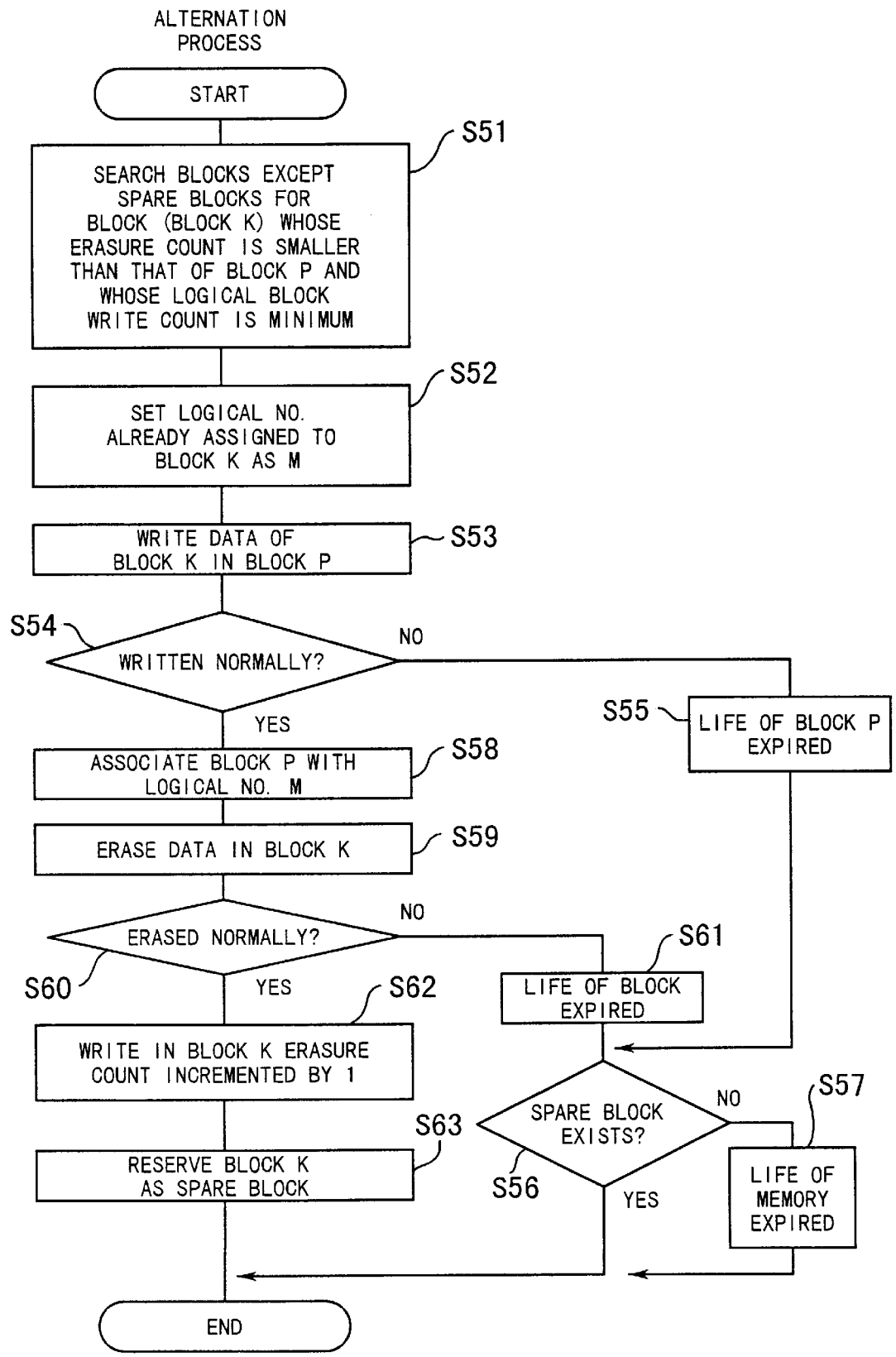
FIG. 11 is a flowchart showing a detailed procedure for an alternation process executed in Step S47 in FIG. 9.

FIG. 11 shows in detail the procedure for the alternation process executed in Step S47 in FIG. 9.

It is assumed that the alternation process is to be performed with respect to the block P, for example.

First, among the active blocks in all block areas of the flash memory 20 except the spare blocks, that is, among the blocks to which the respective logical block numbers are assigned and which store data in their data area, all those blocks of which the value in the erasure count field c is smaller than the value in the erasure count field c of the block P are searched for. If no such block exists, the alternation process is ended. Among the blocks located as above, a block of which the value in the logical block write count field w is a minimum is detected and set as a block K (S51). If there are a plurality of blocks having an identical minimum value in their field w, a block whose physical block number is the smallest is selected as the block K.

The logical block number assigned to the block K is read out and set as a logical block number M (S52).

The data which has been stored in the data area of the block K is written into the data area of the block P. Also, the value stored in the logical number field 1 of the block K is written into the logical number field 1 of the block P, and the value stored in the logical block write count field w of the block K is written into the logical block write count field w of the block P (S53).

The status code output from the flash memory 20 is checked to determine whether or not the write operation with respect to the block P was performed normally (S54). If the write operation was not performed normally, the life of the block P is regarded as having expired (S55), and if there still exists a spare block in the flash memory 20 (S56), the alternation process is ended. If there is no spare block remaining, the lifetime of the flash memory 20 is regarded as having expired, and the life indicator lamp 70 is lit (S57).

If it is judged in Step S54 that the write operation was performed normally, the physical block number of the block P is associated with the logical block number M and this correspondence is stored in the logical-physical conversion table (S58). Then, the information stored in the information area and the data area of the block K is erased (S59). Before the erasure, however, the values described in the erasure count field c and the alternation reference value field n are held in memory.

The status code output from the flash memory 20 is then checked to determine whether or not the erase operation was normally carried out (S60). If the erase operation was not performed normally, it is judged that the life of the block K has expired (S61). If there still exists a spare block in the flash memory 20 (S56), the alternation process is ended. If there is no spare block remaining, the life of the flash memory 20 is regarded as having expired and the life indicator lamp 70 is lit (S57).

If it is confirmed in Step S60 that the erase operation was normally carried out, a value obtained by adding 1 to the value which had been described in the erasure count field c of the block K and is held in memory is written into the erasure count field c of the block K, and the value which had been described in the alternation reference value field n of the block K and is held in memory is written as it is into the alternation reference value field n of the block K (S62). The block K is then reserved as a spare block (S63).

The process described above will now be explained taking a specific example.

Figure 12:
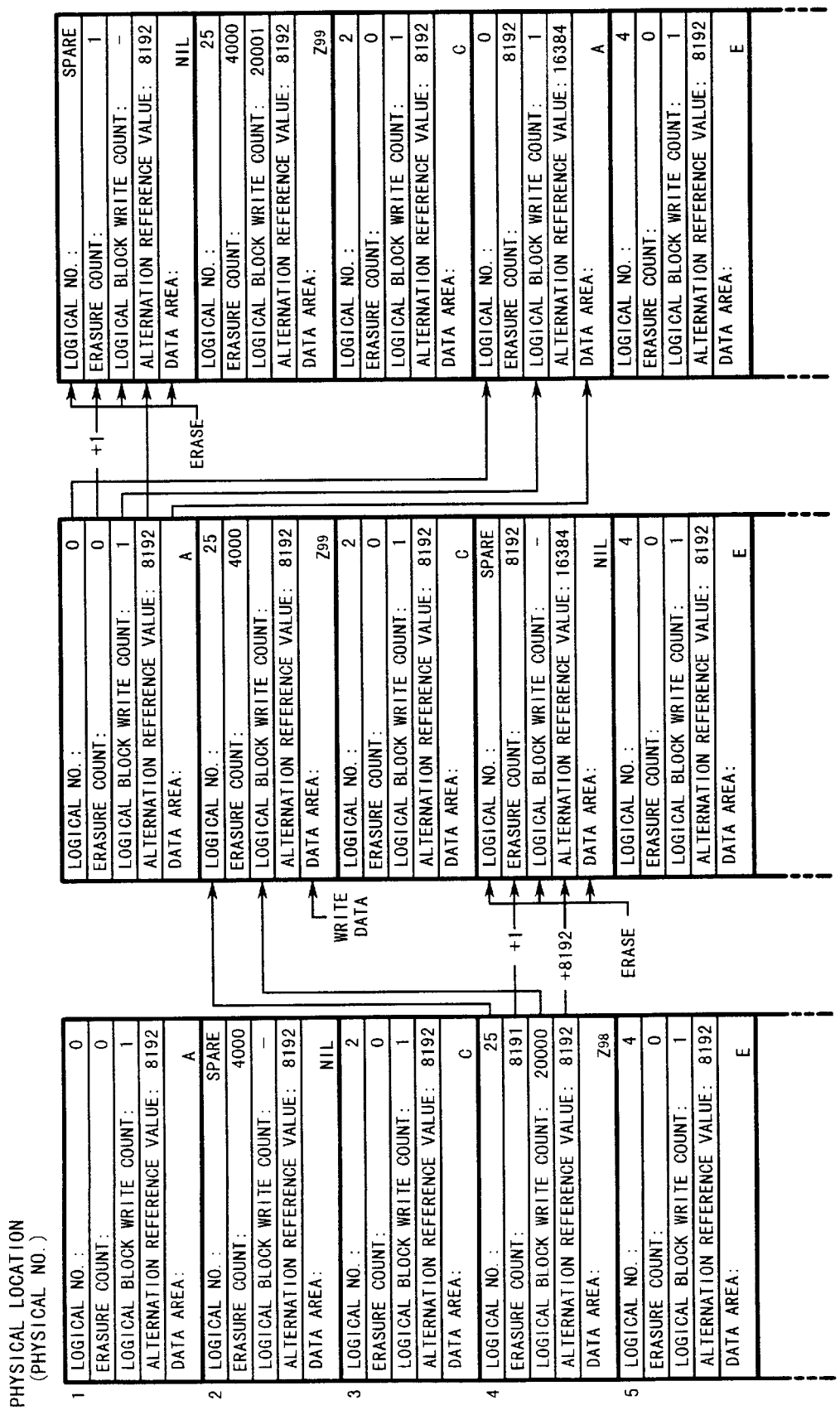
FIG. 12(A) is a diagram showing individual block areas of the flash memory before a write process.
FIG. 12(B) is a diagram showing the individual block areas of the flash memory after the write process and before an alternation process.
FIG. 12(C) is a diagram showing the individual block areas of the flash memory after the alternation process.

FIGS. 12(A) to 12(C) show a specific example of individual block areas in the flash memory 20 with respect to which an alternation process is carried out following a write process, wherein FIG. 12(A) shows a state of the flash memory 20 before the write process, FIG. 12(B) shows a state of the flash memory 20 after the write process and before the alternation process, and FIG. 12(C) shows a state of the flash memory 20 after the alternation process. In FIGS. 12(A) to 12(C), the logical block number M mentioned above with reference to FIG. 11 corresponds to the logical block number 0, the block P in FIG. 11 corresponds to the block area with the physical block number 4, and the block K in FIG. 11 corresponds to the block area with the physical block number 1.

Due to the alternation process described above, when the erase operation has been performed with respect to a certain block, the block is interchanged with another block among the active blocks if the latter block has a smaller value in both the erasure count and the logical block write count, whereby the erasure count can be equalized among the blocks. Namely, there is a slight probability that data will thereafter be written into active blocks of which the erasure count and the logical block write count are both small, and accordingly, if such blocks are left as they are, the life of the flash memory 20 will possibly expire though the erasure counts of these blocks are still small. Such blocks are therefore extracted and turned to spare blocks so that their erasure counts may be increased. Thus, it can be expected that the erasure counts of the individual blocks will uniformly increase up to the average value of 1,000,000 times or thereabouts when the life of the flash memory 20 is judged to have expired.

The above first embodiment uses the logical-physical conversion table, but no such table may be provided and the logical number fields 1 in the information areas of the block areas may be searched to obtain the physical block number corresponding to the detected logical number field 1.

A second embodiment will be now described.

The second embodiment is basically identical in configuration with the first embodiment, except for the following: In the first embodiment, the alternation reference value field n is provided in each block as shown in FIG. 4, and the value in the alternation reference value field n of the block P is updated as shown in Step S46 in FIG. 9. In the second embodiment, by contrast, neither the alternation reference value field n is provided in each block, nor the value in the alternation reference value field n is updated.

Specifically, for the alternation reference value, a plurality of values are preset which include 8192 and integral multiples thereof, for example, and if it is judged in Step S45 in FIG. 9 that the erasure count of the block is equal to any one of these values, it is concluded that the alternation process is required.

This eliminates the need to provide the alternation reference value field n in the information area of each block and also makes it possible to omit the process of writing the alternation reference value in the flash memory 20, executed in Step S46 in FIG. 9.

A third embodiment will be now described.

Figure 13:
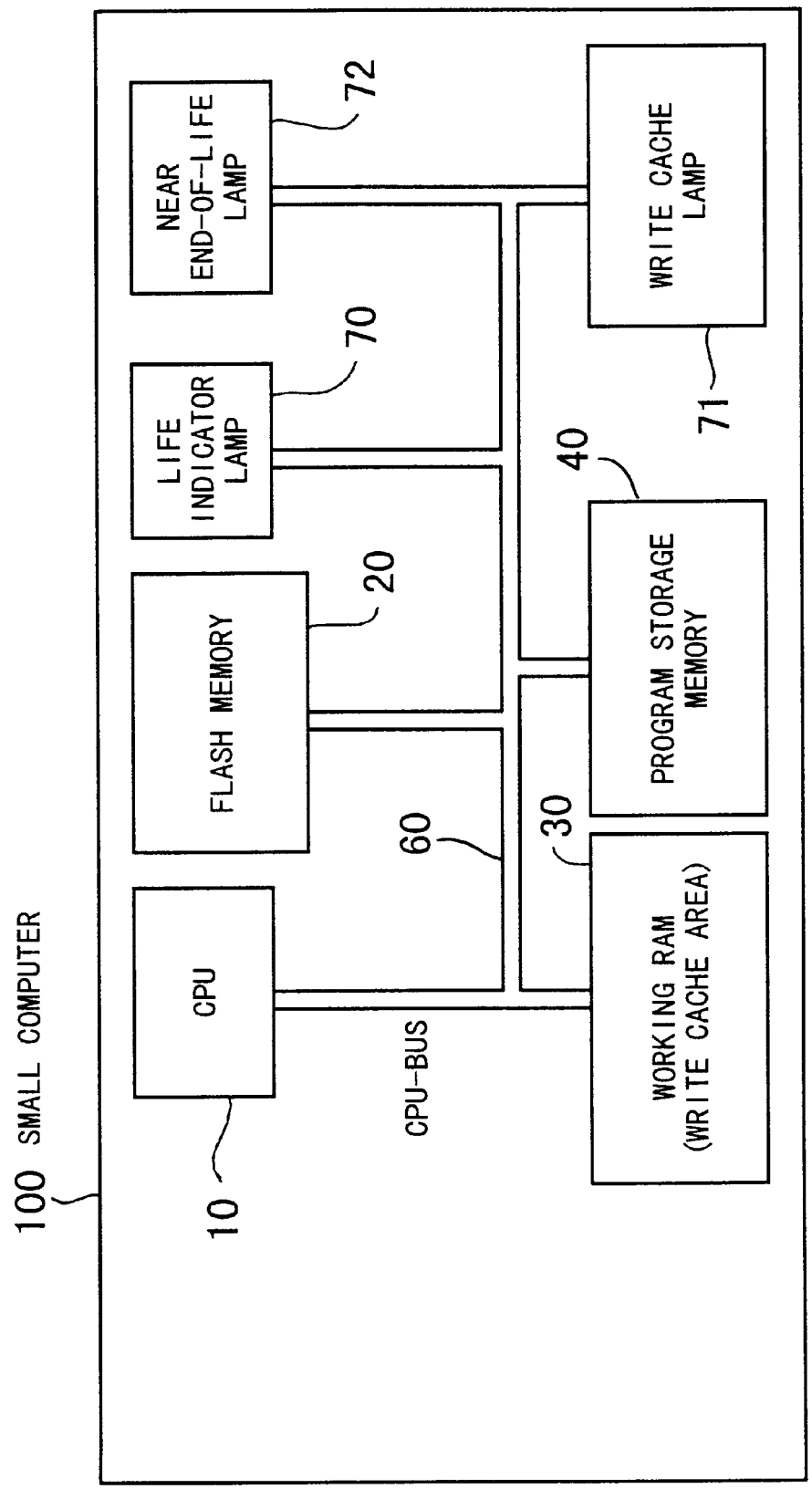
FIG. 13 is a diagram showing the configuration of a small computer including a secondary storage device according to a third embodiment.

FIG. 13 illustrates the configuration of a small computer including a secondary storage device according to the third embodiment. The third embodiment is basically identical in configuration with the first embodiment; therefore, identical reference numerals are used to denote component parts identical with those in the first embodiment and description of such component parts is omitted.

The third embodiment is additionally provided with a near end-of-life lamp 72. The near end-of-life lamp 72 is lit prior to the life indicator lamp 70 when the life of the flash memory 20 is close to its expiration, and serves to give a warning to the operator shortly before the flash memory 20 becomes unusable. That is, the near end-of-life indicator lamp 72 acts as a notifying means to provide notification that the flash memory will soon become unusable.

Figure 14:
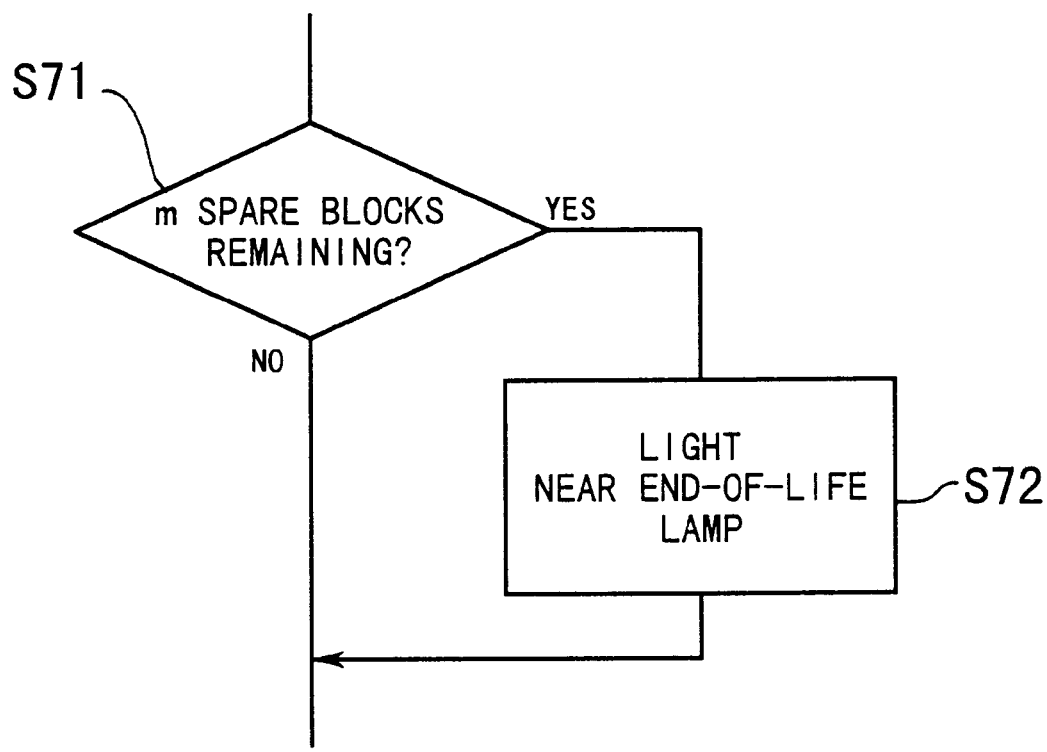
FIG. 14 is part of a chart relating to a process of lighting a near end-of-life lamp.

FIG. 14 is part of a chart relating to a process of lighting the near end-of-life lamp 72. Specifically, Steps S71 and S72 shown in FIG. 14 are inserted between Steps S37 and S31 in FIG. 8, between Step S43 and the end of the process in FIG. 9, and between Step S56 and the end of the process in FIG. 11 of the first embodiment.

When the number of the spare blocks remaining in the flash memory 20 has reduced to m (S71), the near end-of-life lamp 72 is lit (S72).

In the third embodiment, by setting the number m to a suitable value, it is possible to give the operator a warning that the flash memory 20 will soon become unusable, shortly before the memory 20 actually becomes unusable.

A fourth embodiment will be now described.

Figure 15:
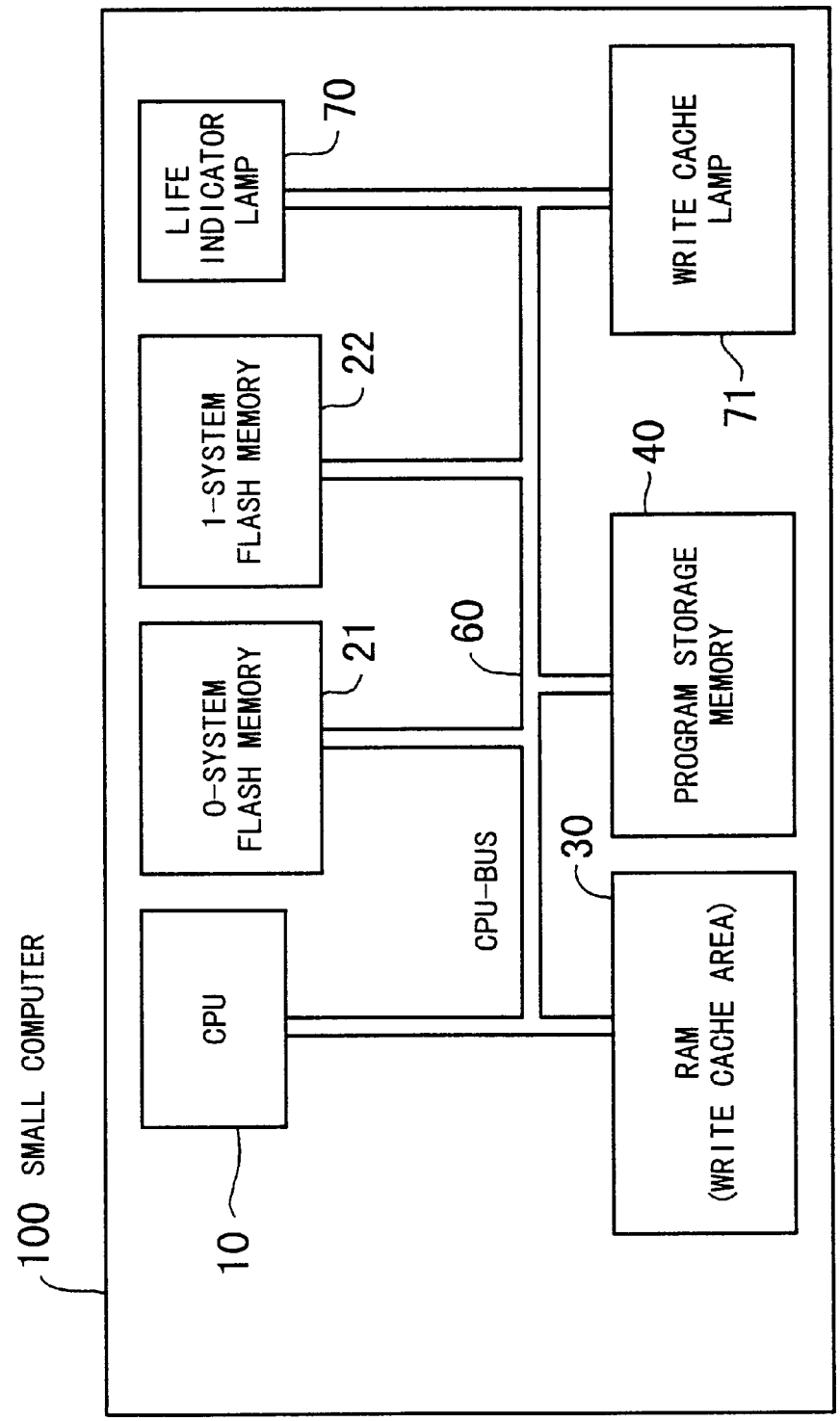
FIG. 15 is a diagram showing the configuration of a small computer including a secondary storage device according to a fourth embodiment.

FIG. 15 illustrates the configuration of a small computer including a secondary storage device according to the fourth embodiment. The fourth embodiment is basically identical in configuration with the first embodiment; therefore, identical reference numerals are used to denote component parts identical with those in the first embodiment and description of such component parts is omitted.

In the fourth embodiment, a 0-system flash memory 21 and a 1-system flash memory 22, instead of the flash memory 20 of the first embodiment shown in FIG. 2, are connected to the CPU-BUS 60. The 0-system and 1-system flash memories 21 and 22 have an identical arrangement and are also identical in arrangement with the flash memory 20 of the first embodiment. The 0-system flash memory 21 functions as an active flash memory while the 1-system flash memory or a temporary storage means 22 functions as a spare flash memory.

Figure 7:
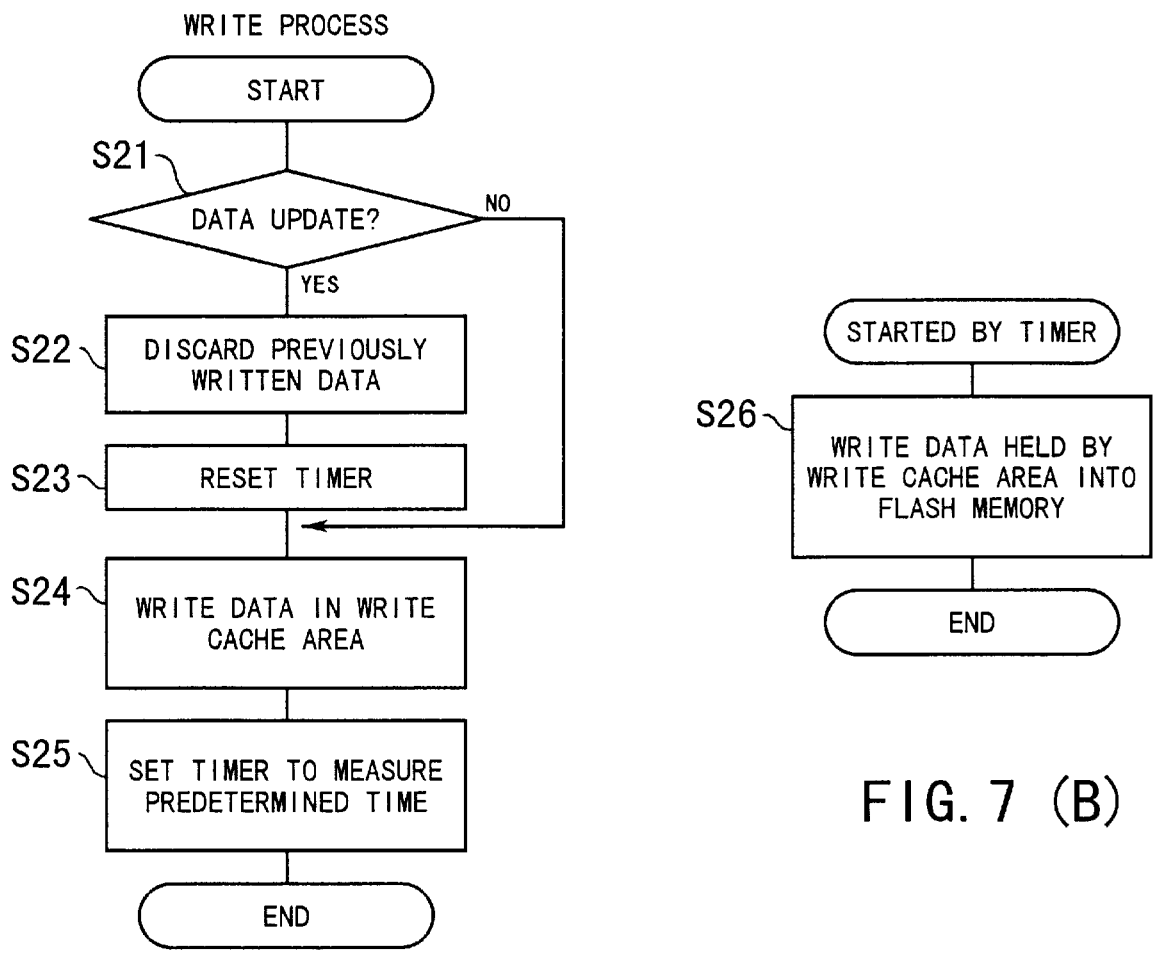
FIG. 7(A) is a flowchart showing details of Step S15 in FIG. 6.
FIG. 7(B) is a flowchart showing a process executed when a timer, operated in the process of FIG. 7(A), has completed measurement of a predetermined time.

To this end, in the fourth embodiment, the timer operated in Step S25 of the first embodiment shown in FIG. 7 is caused to measure lapses of two different time periods from the moment of data write. Specifically, the timer starts to measure time when data is written in the write cache area of the RAM 30, to detect lapses of write wait time periods of 2 and 5 seconds, respectively. After the lapse of 2 seconds, the data is read out and written into the 0-system flash memory 21, and after the lapse of 5 seconds, the data is read out and written into the 1-system flash memory 22.

Identical data is written into the 0-system and 1-system flash memories 21 and 22, while the stored data is read out from the 0-system flash memory 21 only.

Figure 16:
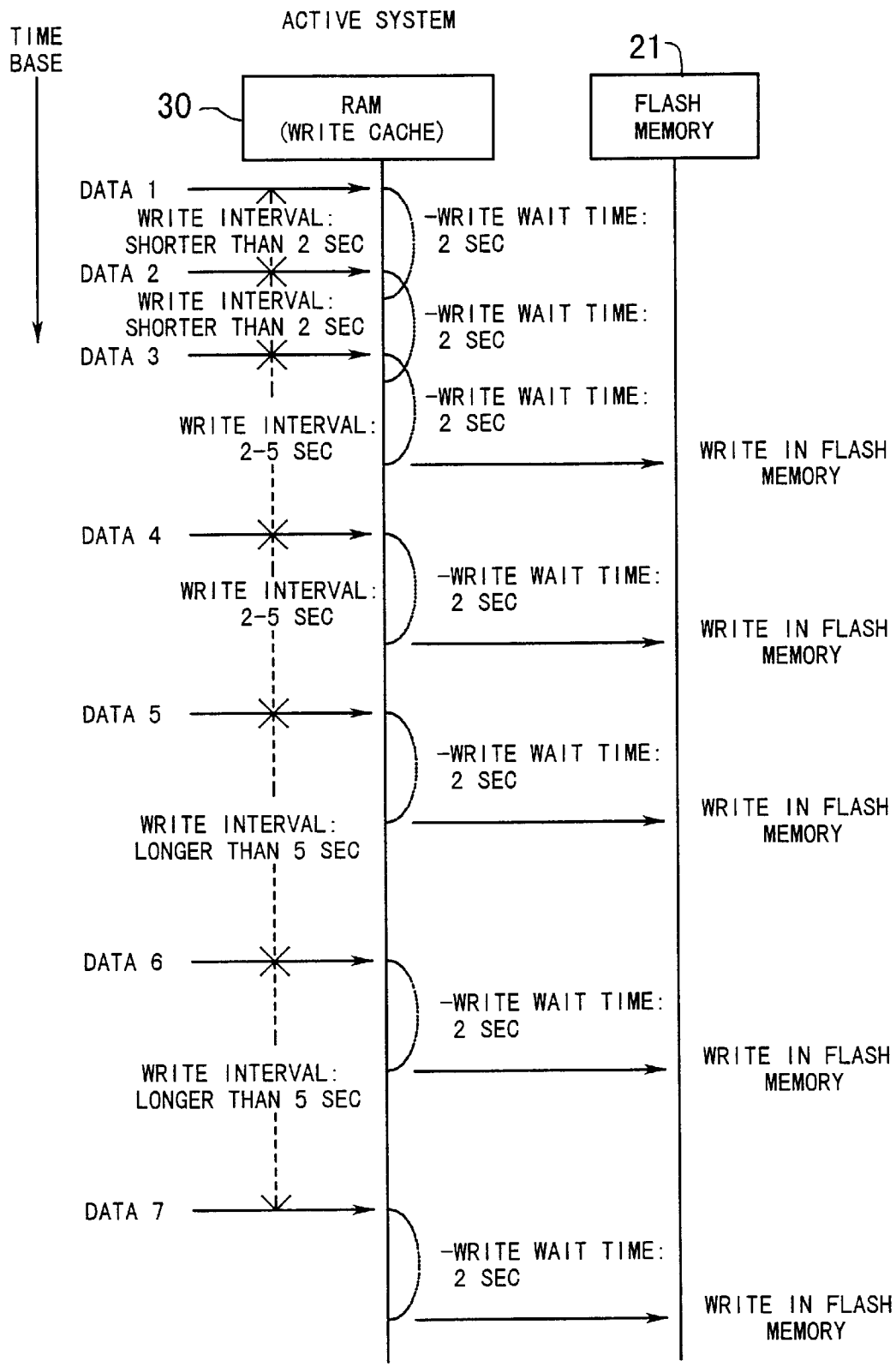
FIG. 16 is a diagram showing timings of reading out data written in a write cache area of RAM and writing the data into a 0-system flash memory.
Figure 17:
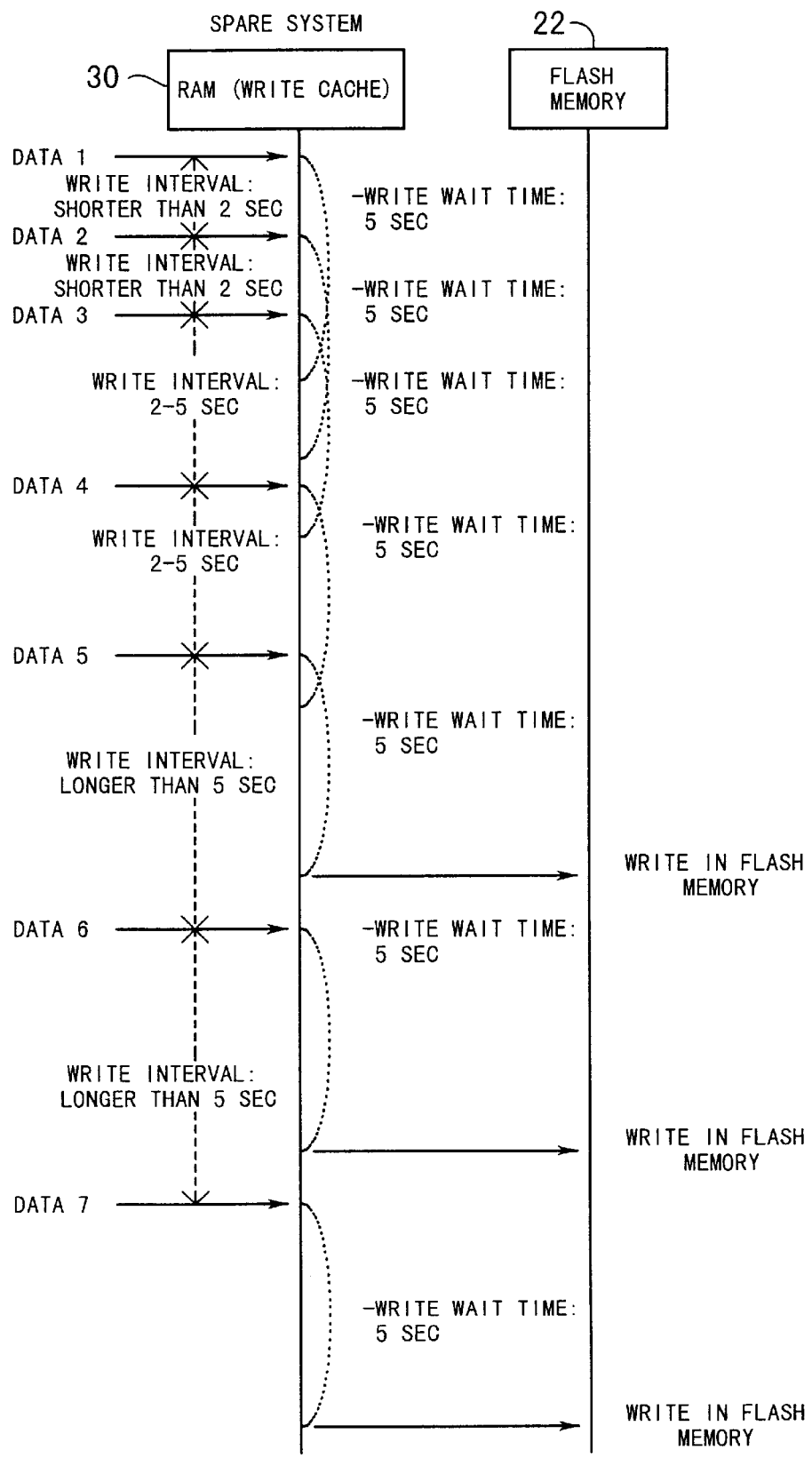
FIG. 17 is a diagram showing timings of reading out data written in the write cache area of the RAM and writing the data into a 1-system flash memory.

FIG. 16 shows the timings of reading out data written in the write cache area of the RAM 30 and writing the data into the 0-system flash memory 21, and FIG. 17 shows the timings of reading out data written in the write cache area of the RAM 30 and writing the data into the 1-system flash memory 22. In FIGS. 16 and 17, data pieces 1 to 7 have an identical logical block number and a data piece with a larger number is an update for a data piece with a smaller number.

Specifically, in both cases shown in FIGS. 16 and 17, where update data is input to the RAM 30 within 2 seconds from the moment of data input, the update data is merely written over the data in the RAM 30 and no data is read out to be written into the flash memory 21 or 22.

On the other hand, where 5 seconds have passed from the moment of data input, data is read out from the RAM 30 and written into the flash memory 21 or 22, in both cases of FIGS. 16 and 17.

In cases where update data is input to the RAM 30 within a time period longer than 2 seconds but shorter than 5 seconds from the moment of data input, in the active system shown in FIG. 16, data is read out from the RAM 30 and written into the flash memory 21. In the spare system shown in FIG. 17, on the other hand, data is not read out from the RAM 30 to be written into the flash memory 22. A first reading means if provided, responsive to detection of lapse of a first predetermined time period by a first measuring means (described below) for reading out a corresponding piece of information and sending the piece of information to the first writing means of the flash memory 21. A second reading means is also provided, responsive to the detection of the lapse of a second predetermined time period by the second measuring means (described below) for reading out a corresponding piece of information and sending the piece of information to the first writing means of the flash memory 22.

Thus, two different write wait time periods are provided and the spare flash memory 22 employs a longer write wait time period; therefore, the number of repetitions of write operation with respect to the spare flash memory 22 can be reduced compared with that with respect to the active flash memory 21, whereby the lifetime of the spare flash memory 22 can be prolonged. Also, the use of two different write wait time periods prevents the lifetimes of the two systems from expiring at the same time. That is, a fist measuring means is provided for measuring a lapse of a first predetermined time period from the start of temporary storage of each piece of information is the flash memory 22. Also, a second measuring means is provided for measuring a lapse of a second predetermined time period from the start of temporary storage of each piece of information in the temporary storage means, the second predetermined time period being longer than the first predetermined time period.

As described above, according to the present invention, when a request to write update information has been made, the update information is written into a spare block area and at the same time the block area in which the corresponding original information has been stored until then is reserved as a spare block area. This permits the number of repetitions of erase operation with respect to the individual block areas to increase in a balanced manner. There is, however, a slight probability that block areas storing information with low update frequency will be turned to spare block areas. Therefore, such block areas storing information with low update frequency are searched for and reserved as spare block areas. In addition, information with low update frequency is stored in block areas of which the erasure count has reached the predetermined reference value. A determination is made to determine whether the information with respect to which the write request has been made is an update for information already stored in block areas. Moreover, resetting occurs, responsive to the determination that the information is update information so as to delete corresponding original information from the temporary storage means and resets to zero the elapsed time period which has been measured by the measuring means from start of the temporary storage of the original information.

Thus, variations in the number of repetitions of erase operation among the block areas can be eliminated, permitting all of the block areas to be used up to their limit.

Further, abnormality in data write or erasure is checked for each of the block areas, and a block area is not judged to be unusable until abnormality is actually detected. This makes it unnecessary to set the limit of use to a minimum limit value of erasure count, whereby each of the block areas can be used up to its actual limit.

Also, a plurality of values are preset as alternation reference values, and the alternation process is executed when the erasure count of a block becomes equal to one of these values.

This eliminates the need to provide the alternation reference value field in the information area of each block, and also makes it possible to omit the process of writing the alternation reference value in the flash memory.

Further, when the number of the spare blocks remaining in the flash memory has reduced to the predetermined number, the near end-of-life lamp is lit.

This makes it possible to give the operator a warning that the flash memory will soon become unusable, shortly before the memory actually becomes unusable.

Furthermore, the flash memory may have a redundant structure using two different write wait time periods so that data may be read out from the write cache area of the RAM at different timings.

Consequently, the number of repetitions of write operation with respect to a spare flash memory can be reduced compared with that with respect to an active flash memory, whereby the life of the spare flash memory can be prolonged. Also, the use of two different write wait time periods serves to prevent the lifetimes of the two systems from coming to an end at the same time.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be resorted to, falling within the scope of the invention in the appended claims and their equivalents.

What is claimed is:

1. A secondary storage device using a nonvolatile semiconductor memory which permits rewriting of data on a block area-by-block area basis and is provided with spare block areas, comprising:

logical-physical correspondence storing means for storing correspondence between logical block numbers identifying respective pieces of information to be stored and physical block numbers identifying respective block areas constituting the nonvolatile semiconductor memory;

first writing means, responsive to a request to write information accompanied by a logical block number, for writing into a spare first block area the information with respect to which the write request has been made;

physical block number reading means for referring to said logical-physical correspondence storing means to read out a physical block number corresponding to the logical block number accompanying the information with respect to which the write request was made;

first erasing means for erasing information stored in a second block area with the physical block number read out by said physical block number reading means and treating the second block area as a spare block area;

first correspondence modifying means for associating the physical block number of a first block area with the logical block number accompanying the information with respect to which the write request was made, and for causing said logical-physical correspondence storing means to store a correspondence of thus-associated physical and logical block numbers;

searching means for searching all block areas in the nonvolatile semiconductor memory except spare block areas for an alternate block area when a number of repetitions of erasure in the second block area has reached a predetermined reference value;

second writing means for writing into the second block area information stored in the alternate block area located by said searching means;

second correspondence modifying means for associating a physical block number of the second block area with the logical block number of the information stored in the alternate block area and causing said logical-physical correspondence storing means to store the correspondence of the thus-associated physical and logical block numbers; and second erasing means for erasing the information stored in the alternate block area and treating the alternate block area as a spare block area.

2. The secondary storage device according to claim 1, wherein said first writing means includes decision means for selecting a block area of which the number of repetitions of erasure is a minimum from among all spare block areas in the nonvolatile semiconductor memory, and setting a selected block area as the first block area.

3. The secondary storage device according to claim 1, wherein said searching means includes updating means for updating the predetermined reference value to a greater value when the number of repetitions of erasure in a second block area has reached the predetermined reference value.

4. The secondary storage device according to claim 1, wherein said predetermined reference value is set separately for each block area.

5. The secondary storage device according to claim 1, wherein said predetermined reference value includes a plurality of predetermined values, and said searching means searches for an alternate block area when the number of repetitions of erasure in the second block area has become equal to any one of the predetermined values.

6. The secondary storage device according to claim 1, wherein said searching means includes decision means for selecting a block area whose number of repetitions of erasure is smaller than that of the second block area and whose number of repetitions of logical block write is a minimum from among all block areas in the nonvolatile semiconductor memory except spare block areas, and setting a selected block area as an alternate block area.

7. The secondary storage device according to claim 1, further comprising monitoring means for monitoring write process and erase process by corresponding ones of said first writing means, said first erasing means, said second writing means and said second erasing means; and inhibiting means for inhibiting use of a block area which is a target of the write or erase process if it is judged, as a result of the monitoring by said monitoring means, that a process was not performed normally.

8. The secondary storage device according to claim 7, further comprising checking means for determining whether there is a spare block area of which a use is not inhibited by said inhibiting means, among block areas except those of which the use is inhibited; and notifying means for providing notification that the nonvolatile semiconductor memory is unusable, when it is judged by said checking means that there is no spare block area.

9. The secondary storage device according to claim 7, further comprising checking means for determining whether or not there is a spare block area of which a use is not inhibited by said inhibiting means, among block areas except those of which the use is inhibited; and notifying means for providing notification that the nonvolatile semiconductor memory will soon become unusable, when it is judged by said checking means that there remains a predetermined number of spare block areas.

10. The secondary storage device according to claim 1, further comprising temporary storage means, responsive to a request to write information, for temporarily storing pieces of information with respect to each of which the write request has been made, separately according to information pieces;

measuring means for measuring lapse of a predetermined time period from start of temporary storage of each piece of information in said temporary storage means; and reading means, responsive to detection of lapse of the predetermined time period by said measuring means, for reading out a corresponding piece of information and sending the piece of information to said first writing means.

11. The secondary storage device according to claim 10, further comprising determining means, responsive to a request to write information, for determining whether the information with respect to which the write request has been made is an update for information already stored in said temporary storage means; and resetting means, responsive to a judgment by said determining means that the information is update information, for deleting corresponding original information from said temporary storage means and resetting to zero the elapsed time period which has been measured by said measuring means from start of temporary storage of the original information.

12. The secondary storage device according to claim 10, wherein said temporary storage means comprises a cache memory.

13. The secondary storage device according to claim 1, wherein said nonvolatile semiconductor memory includes at least two, active and spare memories having an identical arrangement, each of said logical-physical correspondence storing means, said first writing means, said physical block number reading means, said first erasing means, said first correspondence modifying means, said searching means, said second writing means, said second correspondence modifying means and said second erasing means includes at least two means having a corresponding function, said secondary storage device further comprises temporary storage means, responsive to a request to write information, for temporarily storing pieces of information with respect to each of which the write request has been made, separately according to information pieces;

first measuring means for measuring lapse of a first predetermined time period from start of temporary storage of each piece of information in said temporary storage means;

second measuring means for measuring lapse of a second predetermined time period from start of temporary storage of each piece of information in said temporary storage means, the second predetermined time period being longer than the first predetermined time period;

first reading means, responsive to detection of lapse of the first predetermined time period by said first measuring means, for reading out a corresponding piece of information and sending the piece of information to said first writing means of the active nonvolatile semiconductor memory; and second reading means, responsive to detection of lapse of the second predetermined time period by said second measuring means, for reading out a corresponding piece of information and sending the piece of information to said first writing means of the spare nonvolatile semiconductor memory.

14. The secondary storage device according to claim 13, further comprising determining means, responsive to a request to write information, for determining whether or not the information with respect to which the write request has been made is an update for information already stored in said temporary storage means; and resetting means, responsive to a judgment by said determining means that the information is update information, for deleting corresponding original information from said temporary storage means and resetting to zero the elapsed time periods which have been measured by said first and second measuring means from start of temporary storage of the original information.

15. The secondary storage device according to claim 13, wherein said temporary storage means comprises a cache memory.

16. The secondary storage device according to claim 1, wherein said nonvolatile semiconductor memory comprises a flash memory.

17. A secondary storage device including a nonvolatile semiconductor memory made up of individual block areas, comprising:

means for permitting rewriting of data on a block-by-block area basis; and spare blocks which are used to store data when at least one of the individual blocks has an expired life, said spare blocks being selected based on a number of erasure operations that have been performed on the spare blocks, with the selected spare blocks being those with a fewest number of erasures.

18. A secondary storage device as claimed in claim 17 wherein said secondary storage device is a flash memory.

* * * * *